US 8,018,765 B2

(12) United States Patent
Fontana, Jr. et al.

(10) Patent No.: US 8,018,765 B2
(45) Date of Patent: Sep. 13, 2011

(54) THREE-DIMENSIONAL MAGNETIC MEMORY

(75) Inventors: Robert E. Fontana, Jr., San Jose, CA (US); Andreas Moser, San Jose, CA (US); Hal J. Rosen, Los Gatos, CA (US); Bruce D. Terris, Sunnyvale, CA (US); Ching Hwa Tsang, Sunnyvale, CA (US)

(73) Assignee: Hitachi Global Storage Technologies Netherlands, B.V., Amsterdam (NL)

( * ) Notice: Subject to any disclaimer, the term of this patent is extended or adjusted under 35 U.S.C. 154(b) by 0 days.

(21) Appl. No.: 12/553,670

(22) Filed: Sep. 3, 2009

(65) Prior Publication Data
US 2010/0002487 A1    Jan. 7, 2010

Related U.S. Application Data

(63) Continuation of application No. 12/116,111, filed on May 6, 2008, now Pat. No. 7,606,065, which is a continuation of application No. 11/615,618, filed on Dec. 22, 2006, now Pat. No. 7,388,776.

(51) Int. Cl.
*G11C 11/15* (2006.01)
*G11C 11/14* (2006.01)

(52) U.S. Cl. .......................... 365/173; 365/158; 365/171
(58) Field of Classification Search ................... 365/173
See application file for complete search history.

(56) References Cited

U.S. PATENT DOCUMENTS

| | | | | |
|---|---|---|---|---|
| 6,815,082 B2 * | 11/2004 | Girt | ............................ | 428/828.1 |
| 6,829,161 B2 * | 12/2004 | Huai et al. | .................... | 365/158 |
| 6,925,000 B2 * | 8/2005 | Sussner | .......................... | 365/158 |
| 7,606,065 B2 * | 10/2009 | Fontana et al. | ............... | 365/173 |
| 2002/0024842 A1 * | 2/2002 | Spitzer et al. | ................. | 365/173 |
| 2004/0100855 A1 * | 5/2004 | Saito et al. | ..................... | 365/232 |

* cited by examiner

*Primary Examiner* — Son L Mai
(74) *Attorney, Agent, or Firm* — Duft Bornsen & Fishman, LLP

(57) ABSTRACT

Magnetic memories and methods are disclosed. A magnetic memory as described herein includes a plurality of stacked data storage layers to form a three-dimensional magnetic memory. Bits may be written to a data storage layer in the form of magnetic domains. The bits can then be transferred between the stacked data storage layers by heating a neighboring data storage layer, which allows the magnetic fields from the magnetic domains to imprint the magnetic domains in the neighboring data storage layer. By imprinting the magnetic domains into the neighboring data storage layer, the bits are copied from one data storage layer to another.

20 Claims, 23 Drawing Sheets

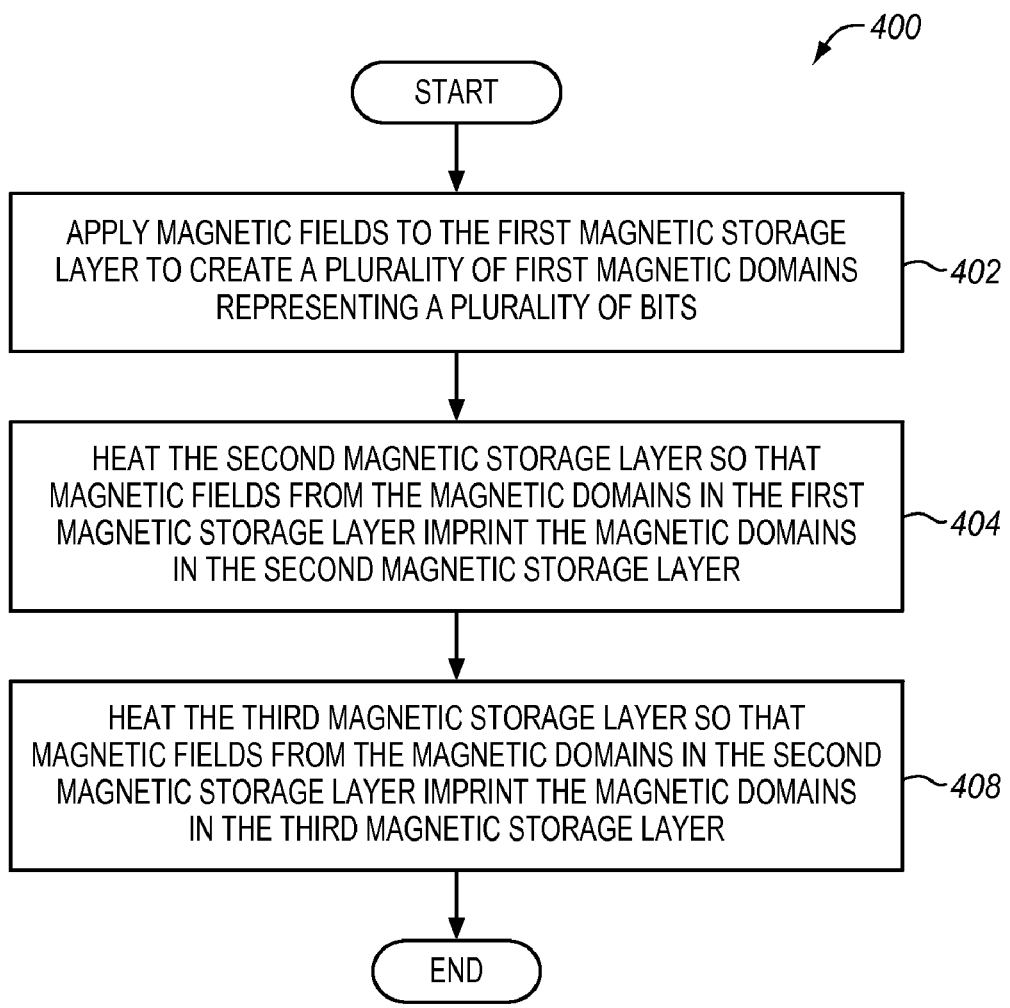

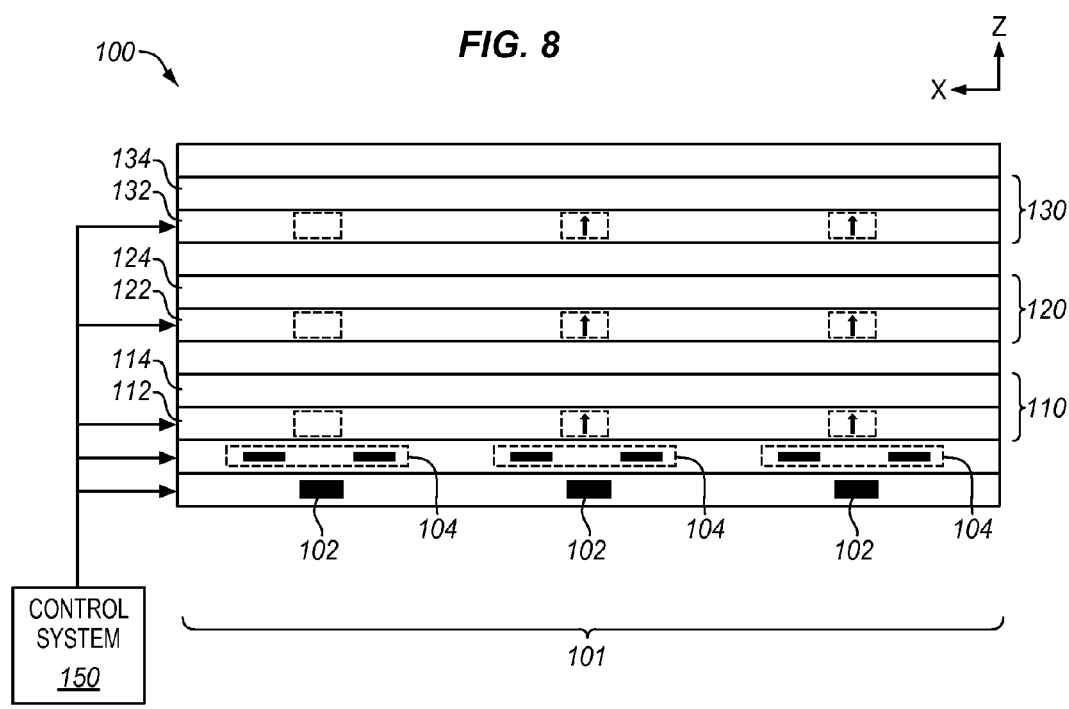
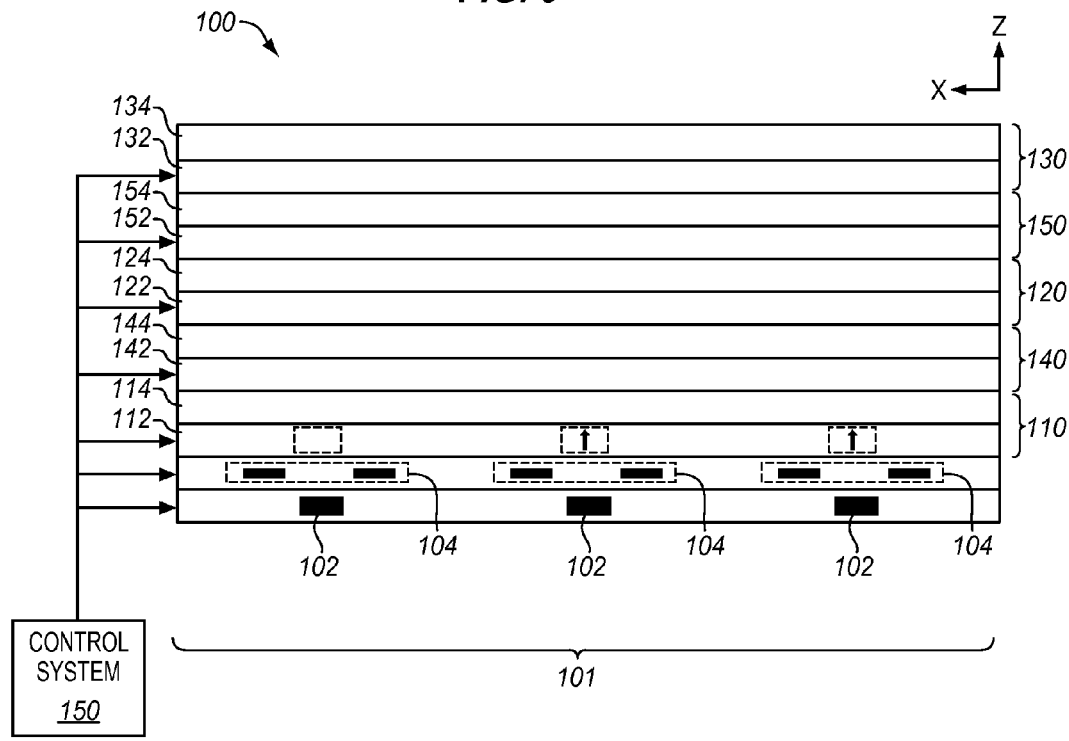

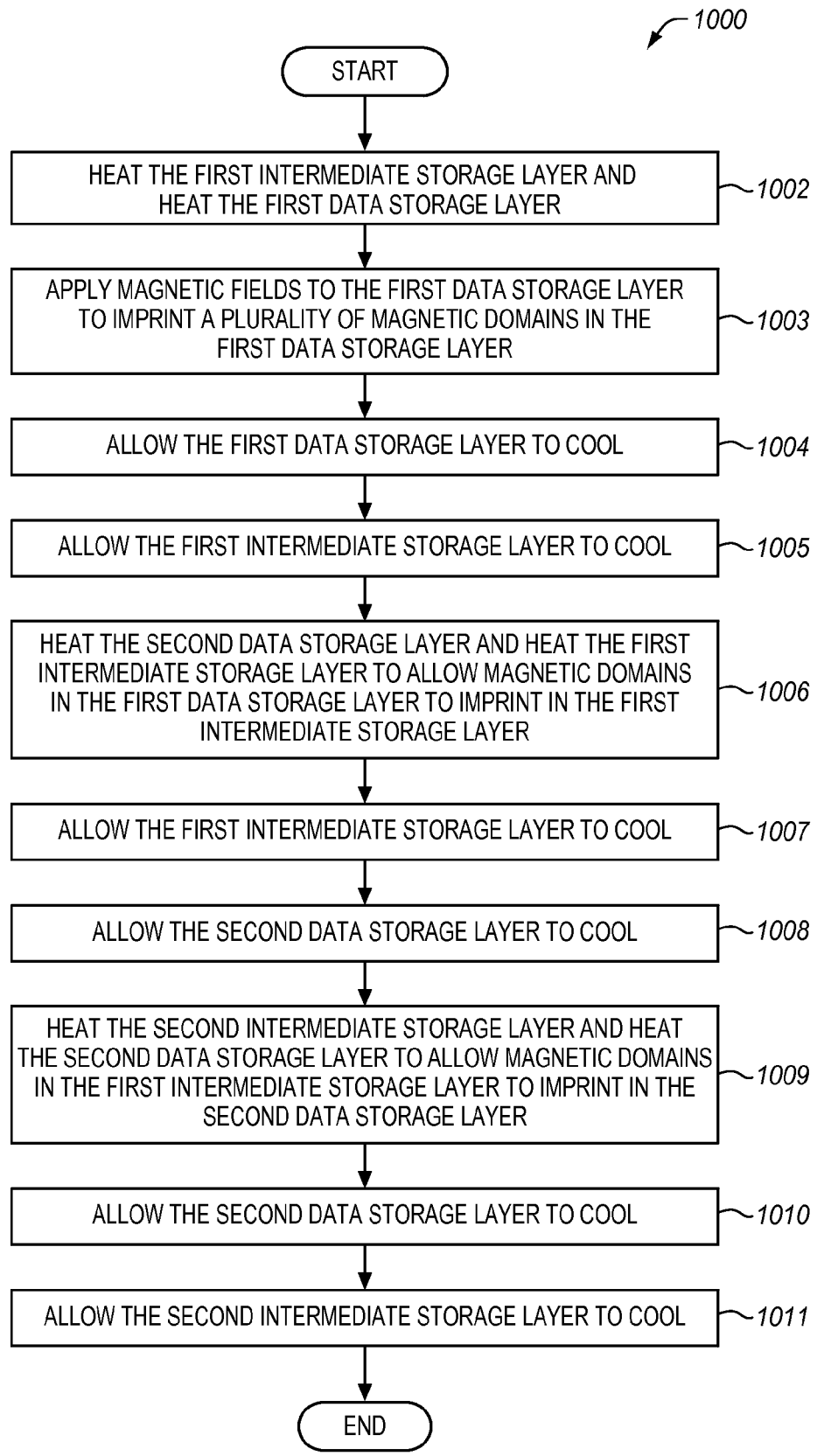

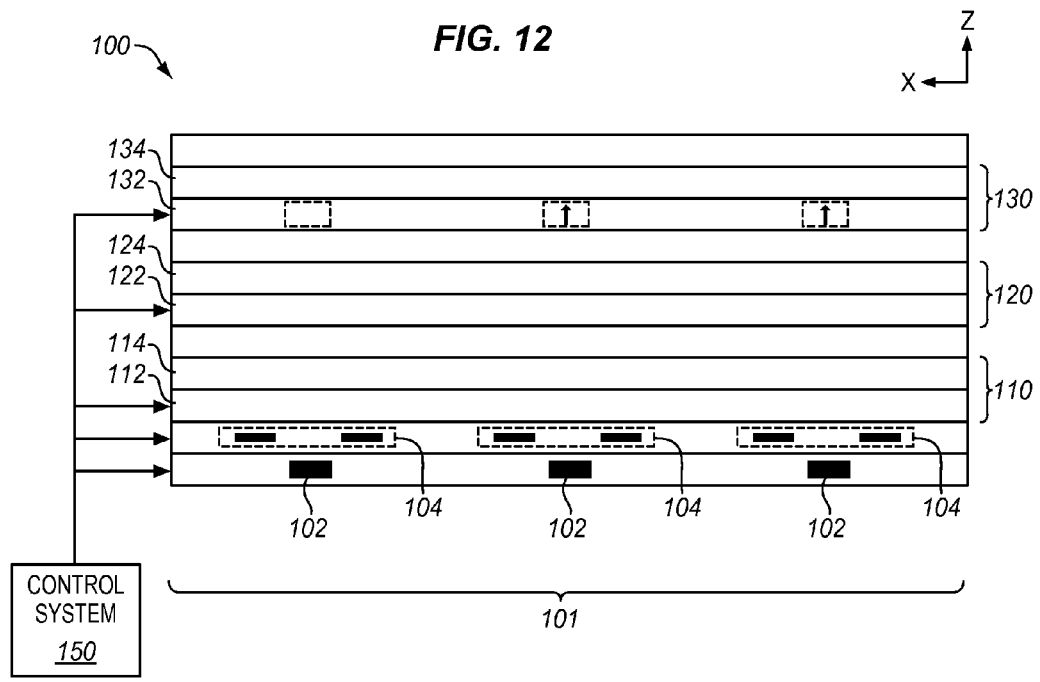
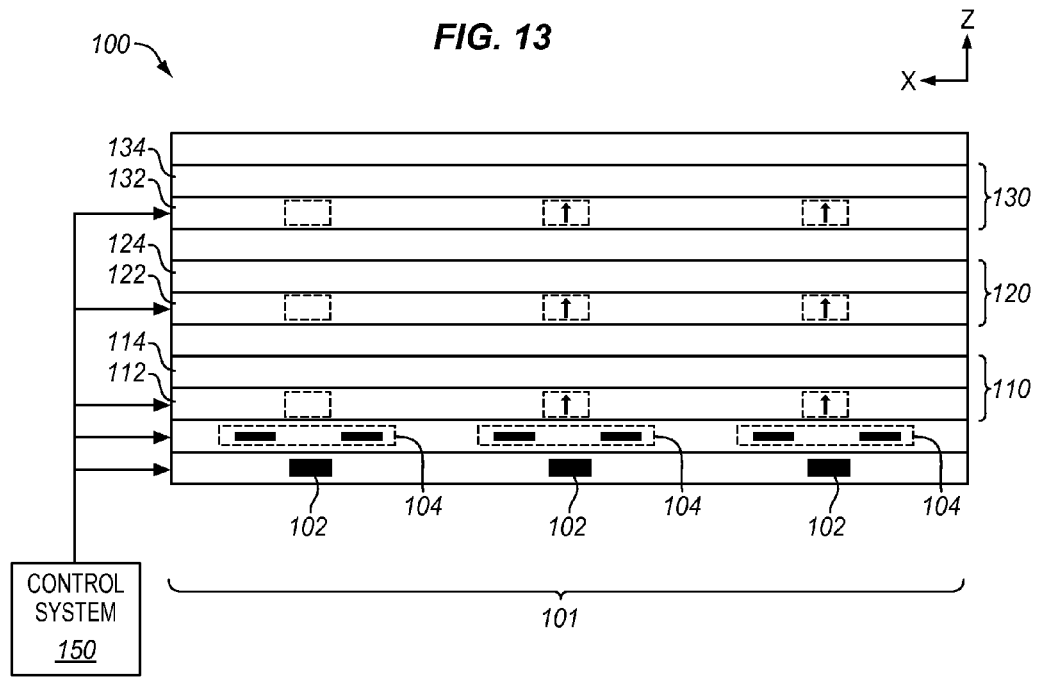

FIG. 19 ← 112
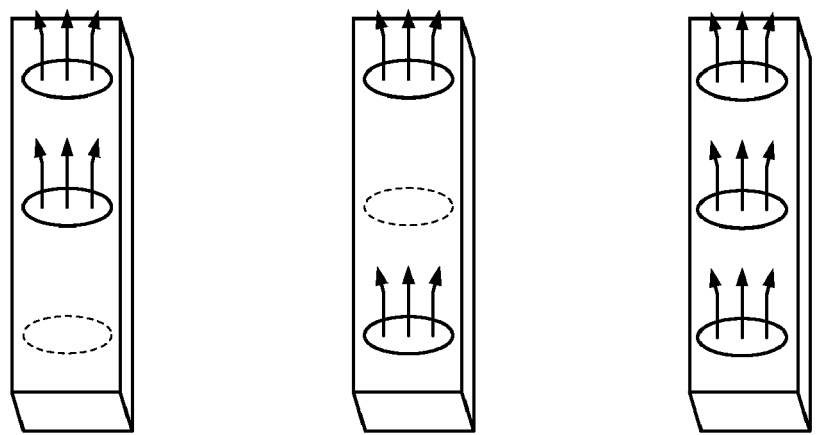
FIG. 20 ← 122
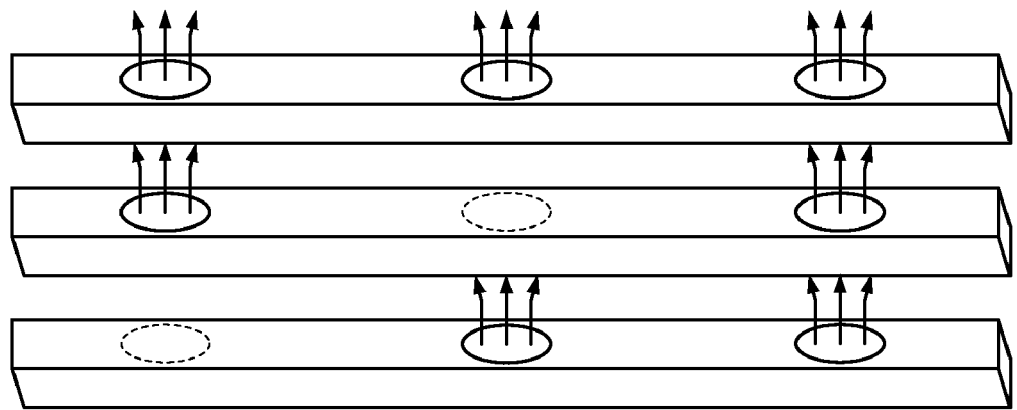

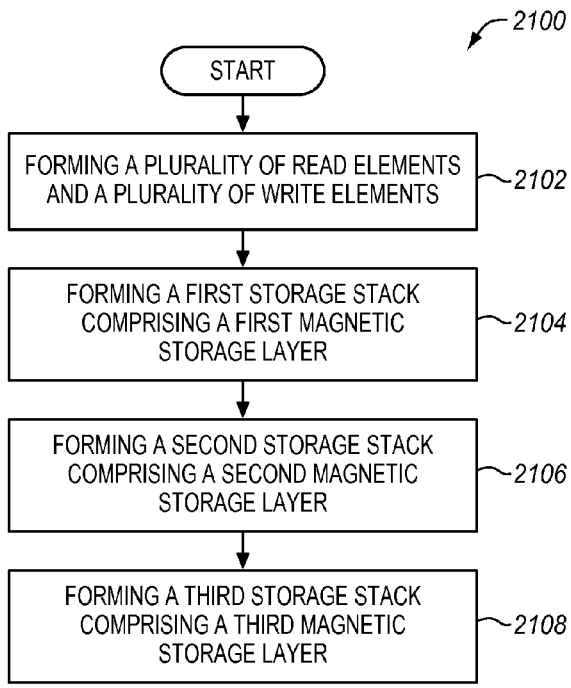
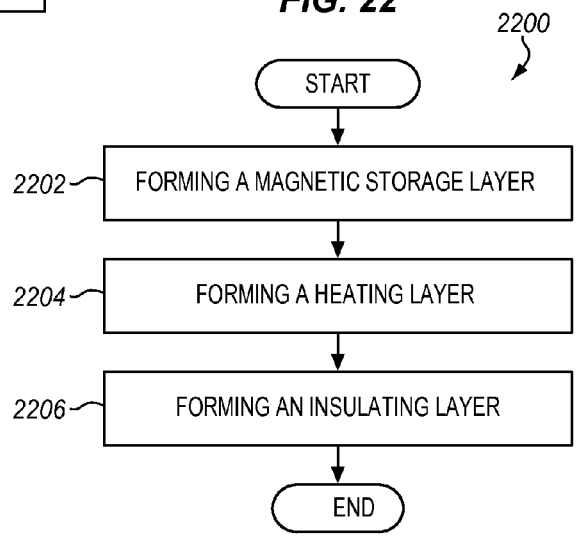
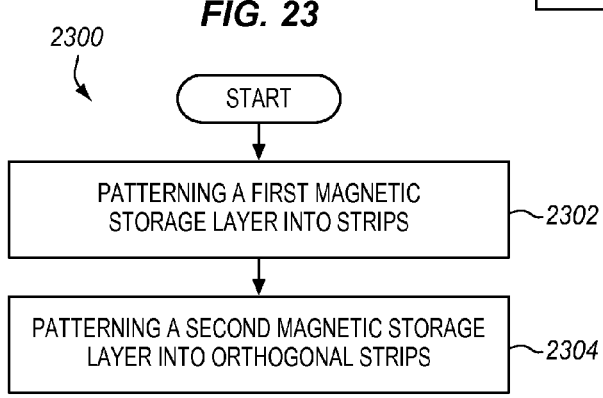

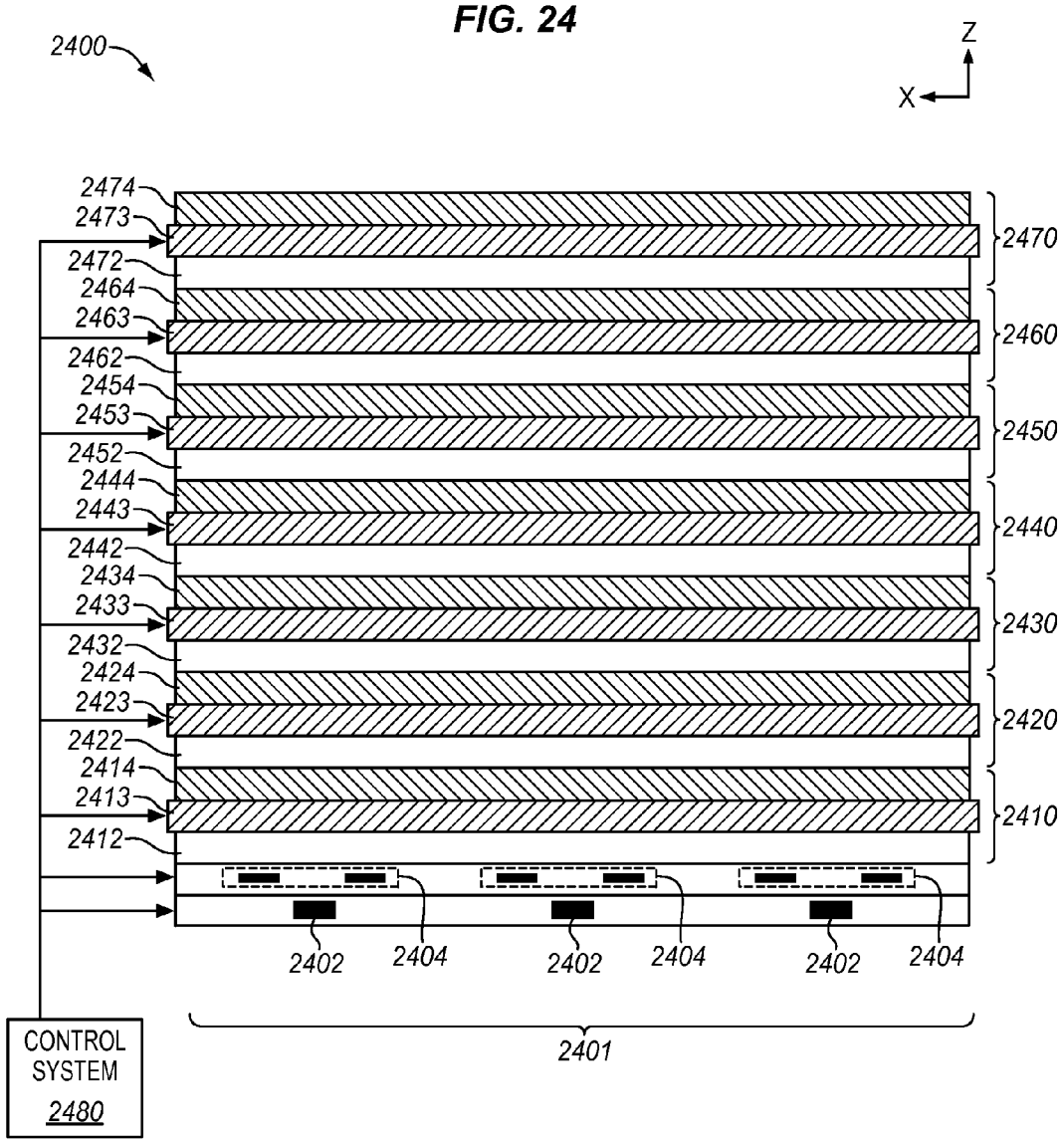

THREE-DIMENSIONAL MAGNETIC MEMORY

RELATED APPLICATIONS

This non-provisional patent application is a continuation of U.S. patent application Ser. No. 12/116,111 filed on May 6, 2008, which is a continuation of U.S. Pat. No. 7,388,776 filed on Dec. 22, 2006, both of which are incorporated herein by reference.

BACKGROUND OF THE INVENTION

1. Field of the Invention

The invention is related to the field of memories and, in particular, to a three-dimensional magnetic memory comprised of a stack of data storage layers. More particularly, the three-dimensional magnetic memory allows for the transfer of bits between the data storage layers.

2. Statement of the Problem

Solid-state memory is a nonvolatile storage medium that uses no moving parts. Some examples of solid-state memory are flash memory and MRAM (magnetoresistive random access memory). Solid-state memories provide advantages over conventional disk drives in that data transfers to and from solid-state memories take place at a much higher speed than is possible with electromechanical disk drives. Solid-state memories may also have a longer operating life and may be more durable due to the lack of moving parts. One problem with traditional solid-state memories is that storage capacity is much less than can be achieved with electromechanical disk drives. For instance, a common flash memory can store up to approximately 1 gigabyte (GB), whereas a common hard drive can store up to 100 GB or more. The cost per megabyte is higher for solid-state memories than for electromechanical disk drives.

Solid-state memories have a size that is determined by a minimum feature size (F). One problem with solid-state magnetic memories (as opposed to flash memory) is the cell density of the memory. A typical solid-state magnetic memory has a cell size that is large compared to flash memories due to the nature of magnetic fields from current lines extending over a typical 4 F distance range. For instance, an MRAM may have a cell size of 32 $F^2$ while a flash memory may have a cell size of 4 $F^2$. The larger cell size of solid-state magnetic memories unfortunately relates to a reduced cell density.

It may thus be desirable to design solid-state magnetic memories that have reduced cell size.

SUMMARY OF THE SOLUTION

The invention solves the above and other related problems with a three-dimensional solid-state magnetic memory. The three-dimensional magnetic memory includes a plurality of stacked data storage layers where each data storage layer is adapted to store bits of data. The bits can be transferred between the data storage layers as desired. By using stacked data storage layers to form a three-dimensional magnetic memory, the net cell size is advantageously reduced which allows for increased cell density. For instance, assume a two-dimensional magnetic memory initially has a cell size of 16 $F^2$. If the magnetic memory is implemented with four stacked data storage layers as described herein instead of one data storage layer, then the effective cell size can be reduced to 4 $F^2$. If the magnetic memory is implemented with sixteen stacked data storage layers as described herein instead of one data storage layer, then the effective cell size can be reduced to 1 $F^2$. The three-dimensional magnetic memory as described herein can advantageously compete with flash memories and disk drives in terms of cell density (or bit density).

One embodiment of the invention is a magnetic memory having stacked data storage layers. The magnetic memory includes a first storage stack including a first data storage layer defining a first plane. The stack is a sequence of thin films, deposited one on top of another, and forms a fundamental building block of the magnetic memory described herein. The magnetic memory further includes a second storage stack proximate to the first storage stack, where the second storage stack includes a second data storage layer defining a second plane that is parallel to the first plane. The first plane and the second plane are in the X-Y direction, and the data storage layers are thus stacked in the Z direction. The magnetic memory may further include a third storage stack proximate to the second storage stack, where the third storage stack includes a third data storage layer defining a third plane that is parallel to the second plane. The magnetic memory may further include a fourth storage stack, a fifth storage stack, etc, depending on desired implementations.

The magnetic memory further includes a plurality of write elements proximate to the first data storage layer. The write elements are adapted to apply magnetic fields to the first data storage layer to create a plurality of magnetic domains in the first data storage layer. The magnetic domains represent a plurality of bits being stored in the first data storage layer. The magnetic memory further includes a control system adapted to heat the second data storage layer so that magnetic fields from the magnetic domains in the first data storage layer imprint the magnetic domains in the second data storage layer. By imprinting the magnetic domains into the second data storage layer, the bits are copied from the first data storage layer to the second data storage layer.

The control system may be adapted to transfer the bits between the data storage layers of the magnetic memory as desired. For instance, the control system may be further adapted to heat a third data storage layer so that magnetic fields from the magnetic domains in the second data storage layer imprint the magnetic domains in the third data storage layer. By imprinting the magnetic domains into the third data storage layer, the bits are copied from the second data storage layer to the third data storage layer. The control system may be further adapted to transfer the bits in the other direction, such as from the third data storage layer to the second data storage layer, and from the second data storage layer to the first data storage layer.

In another embodiment, the magnetic memory further includes a first intermediate stack between the first storage stack and the second storage stack, and a second intermediate stack between the second storage stack and the third storage stack, where the first intermediate stack includes a first intermediate storage layer and the second intermediate stack includes a second intermediate storage layer. To copy the bits from the first data storage layer to the second data storage layer, the control system is adapted to heat the second data storage layer above its Curie temperature and to heat the first intermediate storage layer below its Curie temperature. With the first intermediate storage layer heated, magnetic fields from the magnetic domains in the first data storage layer imprint the magnetic domains in the first intermediate storage layer. The control system is further adapted to allow the first intermediate storage layer to cool, and then to allow the second data storage layer to cool, which stores the magnetic domains in the first intermediate storage layer. The control system is then further adapted to heat the second intermediate storage layer above its Curie temperature and to heat the second data storage layer below its Curie temperature. With the second intermediate storage layer heated, magnetic fields from the magnetic domains in the first intermediate storage layer imprint the magnetic domains in the second data storage layer. The control system is further adapted to allow the second data storage layer to cool, and then to allow the second intermediate storage layer to cool, which stores the magnetic domains in the second data storage layer.

In another embodiment, the magnetic memory further includes a plurality of read elements proximate to the first data storage layer. The read elements are adapted to sense magnetic fields from the magnetic domains in the first data storage layer to read the bits from the first data storage layer.

In another embodiment, the magnetic memory further includes an overflow storage system adapted to temporarily store the bits read from the first data storage layer.

In another embodiment, the first data storage layer is patterned into strips. The locations of the strips correspond with the magnetic domains in the first data storage layer. The second data storage layer is also patterned into strips, where the locations of the strips correspond with the magnetic domains in the second data storage layer. The strips of the second data storage layer are orthogonal to the strips of the first data storage layer. The strips of successive data storage layers in the magnetic memory are orthogonal to one another to control the size of the magnetic domains.

In another embodiment, the first storage stack includes a first heating layer and a first insulating layer in addition to the first data storage layer. The first heating layer is adapted to heat the first data storage layer. The first heating layer comprises cross-hatched conductors, where intersection points of the cross-hatched conductors correspond with the locations of the magnetic domains in the first data storage layer. In another embodiment, the widths of the cross-hatched conductors are narrower at the intersection points as compared to the widths of the cross-hatched conductors between the intersection points.

The invention may include other exemplary embodiments described below.

DESCRIPTION OF THE DRAWINGS

The same reference number represents the same element on all drawings.

FIG. 4 is a flow chart illustrating a method of writing bits to the magnetic memory of FIG. 1 in an exemplary embodiment of the invention.

FIG. 8 illustrates the magnetic memory with the bits copied from the second data storage layer to a third data storage layer in an exemplary embodiment of the invention.

FIG. 9 illustrates a cross-sectional view of another embodiment of a magnetic memory where the magnetic memory also includes intermediate stacks.

FIG. 10 is a flow chart illustrating a method of writing bits to a magnetic memory in an exemplary embodiment of the invention.

FIG. 12 illustrates the magnetic memory with the bits stored in the third data storage layer in an exemplary embodiment of the invention.

FIG. 13 illustrates the magnetic memory with the bits copied from the second data storage layer to a first data storage layer in an exemplary embodiment of the invention.

FIG. 19 illustrates the first data storage layer as patterned in an exemplary embodiment of the invention.

FIG. 20 illustrates the second data storage layer as patterned in an exemplary embodiment of the invention.

FIG. 21 is a flow chart illustrating a method of fabricating a magnetic memory in an exemplary embodiment of the invention.

FIG. 22 is a flow chart illustrating a method of fabricating a storage stack in an exemplary embodiment of the invention.

FIG. 23 is a flow chart illustrating a method of patterning data storage layers in an exemplary embodiment of the invention.

FIG. 24 is a cross-sectional view of a more detailed embodiment of a magnetic memory in an exemplary embodiment of the invention.

DETAILED DESCRIPTION OF THE INVENTION

FIGS. 1-32 and the following description depict specific exemplary embodiments of the invention to teach those skilled in the art how to make and use the invention. For the purpose of teaching inventive principles, some conventional aspects of the invention have been simplified or omitted. Those skilled in the art will appreciate variations from these embodiments that fall within the scope of the invention. Those skilled in the art will appreciate that the features described below can be combined in various ways to form multiple variations of the invention. As a result, the invention is not limited to the specific embodiments described below, but only by the claims and their equivalents.

Figure 1:
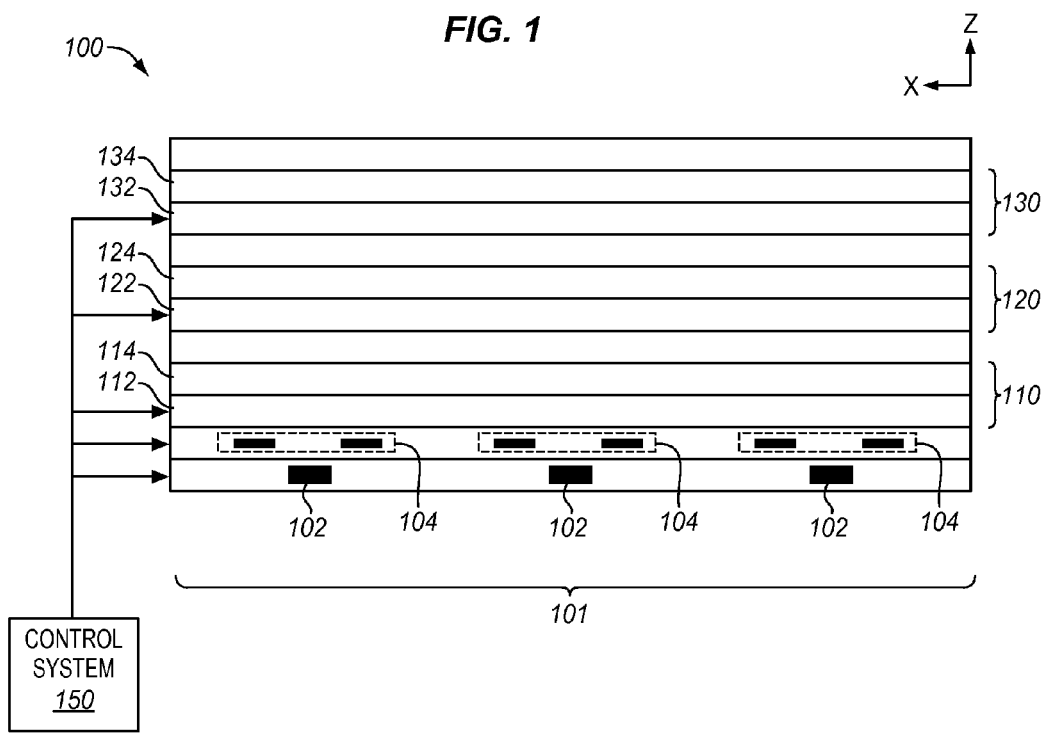
FIG. 1 is a cross-sectional view of a magnetic memory in an exemplary embodiment of the invention.

FIG. 1 is a cross-sectional view of a magnetic memory 100 in an exemplary embodiment of the invention. The cross-sectional view in FIG. 1 only shows a portion of magnetic memory 100, as an actual magnetic memory may extend further in the X, Y, or Z direction. Magnetic memory 100 includes a main column 101 of layers comprising a plurality of read elements 102, a plurality of write elements 104, a first storage stack 110, a second storage stack 120, and a third storage stack 130. Magnetic memory 100 also includes a control system 150 that may be comprised of a plurality of transistors and other elements. Although one main column 101 of layers is shown in FIG. 1, magnetic memory 100 may include a plurality of main columns as shown in FIG. 1. For instance, if the main column 101 shown in FIG. 1 provides 4 Mbits of storage (such as 2K in the X-direction and 2K in the Y direction), then magnetic memory 100 may include a plurality of main columns 101 as shown in FIG. 1 to provide 16 Mbits, 32 Mbits, 64 Mbits, etc.

Read elements 102 and write elements 104 are proximate to storage stack 110, storage stack 110 is proximate to storage stack 120, and storage stack 120 is proximate to storage stack 110 and storage stack 130. Being proximate means that one stack is adjacent or adjoining another stack. There may be more or less storage stacks in magnetic memory 100 that are not illustrated in this embodiment. For instance, magnetic memory 100 may include a fourth storage stack, a fifth storage stack, etc. There may also be intermediate layers between storage stacks 110, 120, and 130. These intermediate layers may be used to facilitate the transfer of bits between the storage stacks, which will be illustrated in FIGS. 9-10.

A storage stack comprises any subset of layers adapted to store bits of data. Storage stack 110 includes one or more layers of material. One of the layers of storage stack 110 comprises a data storage layer 112, which is a layer of magnetic material adapted to store bits. Data storage layer 112 may be comprised of magnetic material having a perpendicular magnetization, such as a TbFeCo, CoPt, or CoPd multilayer. Data storage layer 112 may alternatively be comprised of magnetic material having a horizontal magnetization or a non-perpendicular magnetization. Storage stack 110 may also include one or more insulating layers 114 adapted to insulate heating of data storage layer 112 from other data storage layers. Storage stack 110 may also include a heating layer (not shown) adapted to heat data storage layer 112. Storage stack 120 may have a similar configuration as storage stack 110 having a data storage layer 122, an insulating layer 124, and possibly a heating layer. Storage stack 130 may have a similar configuration as storage stack 110 with a data storage layer 132, an insulating layer 134, and possibly a heating layer.

Data storage layer 112 of storage stack 110 defines a first plane in the X-Y direction. Data storage layer 122 of storage stack 120 defines a second plane in the X-Y direction. Data storage layer 132 of storage stack 130 defines a third plane in the X-Y direction. As is evident in FIG. 1, the first plane, the second plane, and the third plane of the data storage layers are parallel to one another.

Figure 2:
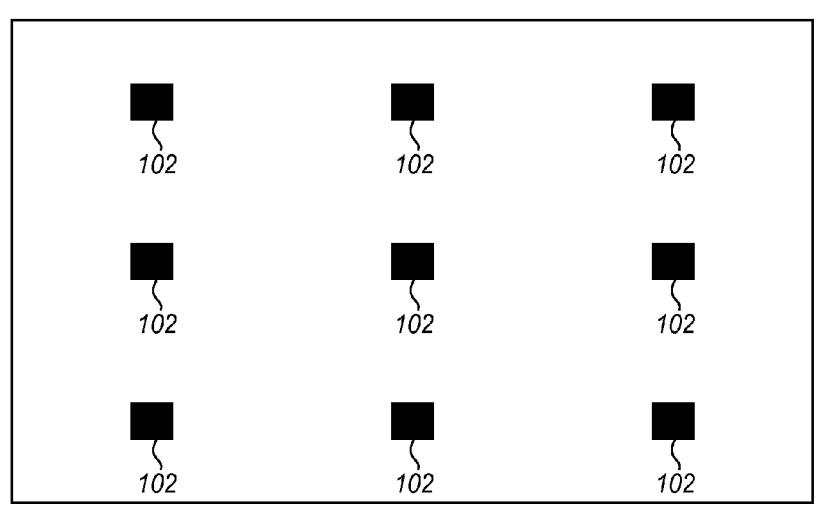
FIG. 2 is a top view of read elements in the magnetic memory of FIG. 1 in an exemplary embodiment of the invention.

FIG. 2 is a top view of read elements 102 in an exemplary embodiment of the invention. Read elements 102 are in an array in the X-Y direction. Read elements 102 are spaced according to a desired bit density in the data storage layers 112, 122, and 132. Read elements 102 comprise any elements adapted to sense magnetic fields from domains that represent bits stored on data storage layer 112. For example, read elements 102 may comprise Hall Effect elements, spin valve elements, or tunnel valve elements.

Figure 3:
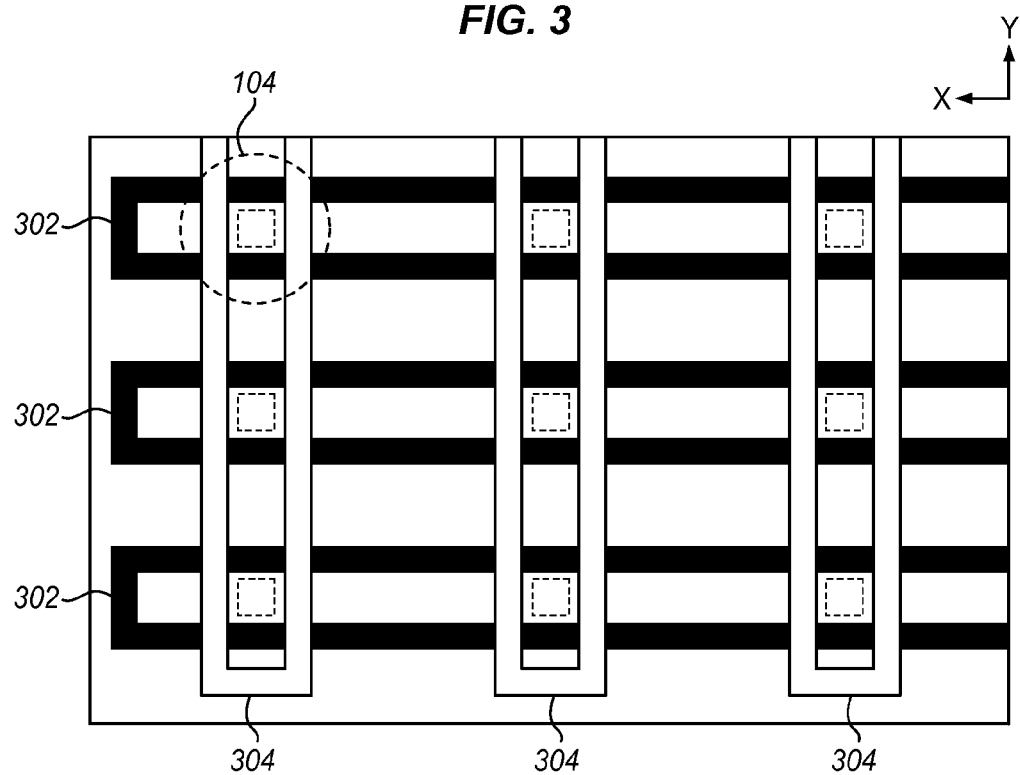
FIG. 3 is a top view of write elements in the magnetic memory of FIG. 1 in an exemplary embodiment of the invention.

FIG. 3 is a top view of write elements 104 in an exemplary embodiment of the invention. Write elements 104 are formed from a cross-point array of current loops. An individual write element 104 is indicated by the dotted circle in FIG. 3. Current loops 302 formed from conductive material travel in the X direction, and current loops 304 travel in the Y direction. The intersection points of the current loops correspond with the locations of the read elements 102 which are illustrated as dotted boxes. Current loops 302 and 304 each generate a magnetic field of magnitude X. In locations where the current loops do not intersect, the magnetic field has a magnitude of X. In locations where the current loops intersect, the magnetic fields from both current loops are additive to generate a magnetic field having a magnitude of 2×. The 2× magnetic field is used to write bits to data storage layer 112 of FIG. 1.

According to features and aspects herein, magnetic memory 100 is adapted to provide storage of bits in the data storage layers 112, 122, and 132 (and possibly other data storage layers not shown). To store the bits in magnetic memory 100, each of the data storage layers 112, 122, and 132 are able to store bits in the X-Y direction. Magnetic memory 100 is also able to transfer bits in the Z direction in FIG. 1 between the data storage layers 112, 122, and 132.

FIG. 4 is a flow chart illustrating a method 400 of writing bits to magnetic memory 100 in an exemplary embodiment of the invention. In step 402, write elements 104 apply magnetic fields to data storage layer 112 to create or imprint a plurality of magnetic domains in data storage layer 112. A magnetic domain comprises a region of magnetization surrounded by regions of a different magnetization (or background magnetization). The magnetic domains represent a plurality of bits of data that is written into data storage layer 112. Magnetic domains may also be referred to herein as regions of magnetization or magnetic imprints. Control system 150 may heat data storage layer 112 to assist in creating the magnetic domains in data storage layer 112. Heating data storage layer 112 to just below its Curie temperature reduces the coercivity (Hc) and allows the magnetization of this layer to be more easily influenced by the magnetic fields from write elements 104. Control system 150 may apply a current directly to data storage layer 112 to apply the heat, as data storage layer 112 comprises a metallic material with some resistance. Control system 150 may alternatively apply a current to a heating layer (not shown) that is included in storage stack 110 proximate to data storage layer 112.

Figure 5:
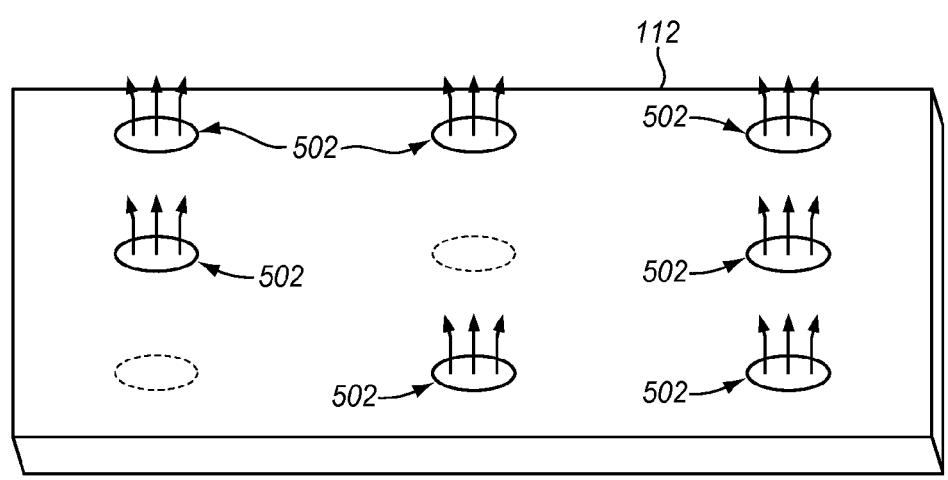
FIG. 5 is an isometric view of a portion of a first data storage layer illustrating bits written to the first data storage layer in an exemplary embodiment of the invention.

FIG. 5 is an isometric view of a portion of data storage layer 112 illustrating bits written to data storage layer 112. Data storage layer 112 has a background magnetization, such as a magnetization perpendicular to the plane pointing downward in FIG. 5. Bits are written to data storage layer 112 in the form of magnetic domains 502. The magnetic domains 502 are formed by changing the magnetization locally to a polarity opposite than the primary magnetization of data storage layer 112. The magnetization of magnetic domains 502 are illustrated by arrows in FIG. 5. The existence of a magnetic domain 502 magnetized opposite to the background magnetization indicates one binary value of a bit, such as a "1". The absence of an oppositely-magnetized domain 502 in a particular region in data storage layer 112 indicates another binary value of a bit, such as a "0". The absence of a magnetic domain 502 in FIG. 5 is illustrated as a dotted circle.

Figure 6:
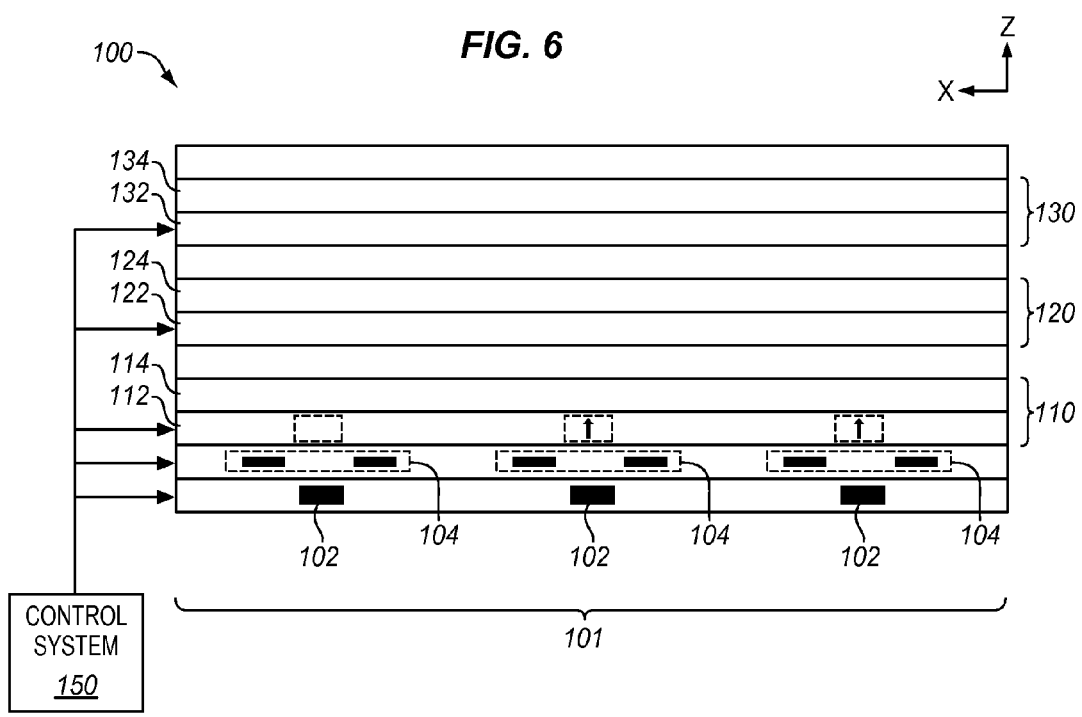
FIG. 6 illustrates the magnetic memory with bits written into the first data storage layer in an exemplary embodiment of the invention.

FIG. 6 illustrates magnetic memory 100 with bits written into data storage layer 112 according to step 402 of FIG. 4. A magnetic domain has been imprinted into data storage layer 112 by the rightmost write element 104 and the middle write element 104. The magnetic domains are indicated by a single arrow pointing upward in a dotted box representing a region proximate to the rightmost write element 104 and a region proximate to the middle write element 104. The background magnetization with no opposite domain has been imprinted into data storage layer 112 proximate to the leftmost write element 104. The absence of an opposite magnetic domain is indicated by a dotted box representing a region proximate to the leftmost write element 104 that does not include an arrow.

Figure 7:
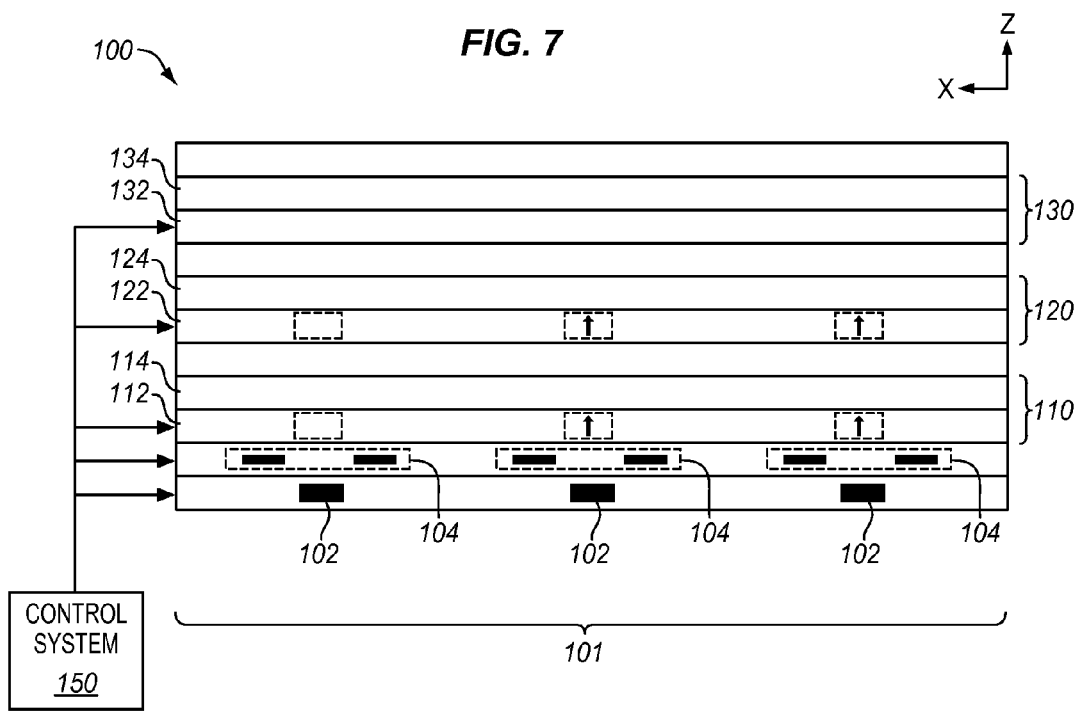
FIG. 7 illustrates the magnetic memory with the bits copied from the first data storage layer to a second data storage layer in an exemplary embodiment of the invention.

With the bits written into data storage layer 112 in FIG. 6, control system 150 may transfer the bits up main column 101 as follows. Control system 150 heats data storage layer 122 so that magnetic fields from the magnetic domains in data storage layer 112 imprint the magnetic domains in data storage layer 122 in step 404 of FIG. 4. By imprinting the magnetic domains from data storage layer 112 to data storage layer 122, the bits stored in data storage layer 112 are copied to data storage layer 122 in the Z direction (upward in FIG. 6). Control system 150 may apply a current directly to data storage layer 122 to apply the heat, or may apply a current to a heating layer (not shown) that is included in storage stack 120 proximate to data storage layer 122. Although heat is used in this embodiment to imprint the magnetic domains from data storage layer 112 to data storage layer 122, other methods or means may be used to facilitate the transfer of the magnetic domains. FIG. 7 illustrates magnetic memory 100 with the bits copied from data storage layer 112 to data storage layer 122 according to step 404 of FIG. 4. The absence of an isolated magnetic domain is also illustrated in FIG. 7 by a dotted box.

The magnetic domains may not be imprinted directly from data storage layer 112 to data storage layer 122. As previously stated, there may be an intermediate layer between data storage layer 112 and data storage layer 122 that facilitates the transfer. For instance, control system 150 may first copy the magnetic domains from data storage layer 112 to the intermediate layer, and then copy the magnetic domains from the intermediate layer to data storage layer 122. The intermediate layer(s) acts as a buffer to prevent other magnetic domains in other layers (such as magnetic domains for other bit patterns) from interfering with the transfer of the magnetic domain from data storage layer 112 to data storage layer 122.

With the bits written into data storage layer 122 in FIG. 7, control system 150 may transfer the bits up main column 101 as follows. Control system 150 heats data storage layer 132 so that magnetic fields from the magnetic domains in data storage layer 122 imprint the magnetic domains in data storage layer 132 in step 408 of FIG. 4. By imprinting the magnetic domains from data storage layer 122 to data storage layer 132, the bits stored in data storage layer 122 are copied to data storage layer 132 in the Z direction. Again, control system 150 may apply a current directly to data storage layer 132 to apply the heat, or may apply a current to a heating layer (not shown) that is included in storage stack 130 proximate to data storage layer 132. FIG. 8 illustrates magnetic memory 100 with the bits copied from data storage layer 122 to data storage layer 132 according to step 408 of FIG. 4. Method 400 in FIG. 4 may include further steps of heating upper layers in magnetic memory 100 to transfer the bits up main column 101.

After copying bits from one data storage layer to another, control system 150 may erase the bits from the sending data storage layer. For instance, to erase bits from data storage layer 112, control system 150 may heat data storage layer 112 to or above its Curie temperature (Tc) to erase the magnetic domains and return data storage layer 112 to its primary or background magnetization after it is cooled. Control system 150 may heat and cool data storage layer 112 in the presence of a bias field in order to return data storage layer 112 to its primary or background magnetization. The bits are thus erased from data storage layer 112. Control system 150 may apply a current directly to data storage layer 112 to apply the heat, or may alternatively apply a current to a heating layer (not shown) that is included in storage stack 110 proximate to data storage layer 112.

In FIG. 8, the bits originally written to data storage layer 112 have been copied to data storage layer 122 and data storage layer 132. The bits may be stored in data storage layer 132, or may be transferred up the stack of magnetic memory 100 (although additional storage stacks have not been illustrated in FIG. 8). With the bits stored in data storage layer 132, control system 150 may erase the bit pattern stored in data storage layer 112 and write elements 104 may write another bit pattern into data storage layer 112. Control system 150 may erase the bit pattern stored in data storage layer 122 and transfer the new bit pattern from data storage layer 112 to data storage layer 122 as described in step 404 of FIG. 4. With one bit pattern stored in data storage layer 132 and another bit pattern stored in data storage layer 122, control system 150 may erase the bit pattern stored in data storage layer 112 and write elements 104 may write yet another bit pattern into data storage layer 112 if desired.

FIG. 9 illustrates a cross-sectional view of another embodiment of magnetic memory 100 where magnetic memory 100 also includes intermediate stacks. In this embodiment, magnetic memory 100 further includes intermediate stacks 140 and 150. An intermediate stack comprises any subset of layers adapted to temporarily store bits of data. Intermediate stack 140 includes one or more layers of material. One of the layers of intermediate stack 140 comprises an intermediate storage layer 142, which is a layer of magnetic material adapted to temporarily store bits. Intermediate storage layer 142 may be comprised of the same material used for the data storage layers 112, 122, and 132, such as TbFeCo or CoPt multilayers. Intermediate storage layer 142 defines a plane parallel to the planes of data storage layers 112, 122, and 132. Intermediate stack 140 may also include one or more insulating layers 144 adapted to insulate heating of intermediate storage layer 142 from other data storage layers. Intermediate stack 140 may also include a heating layer (not shown) adapted to heat intermediate storage layer 142. Intermediate stack 150 may have a similar configuration as intermediate stack 140 having an intermediate storage layer 152, an insulating layer 154, and possibly a heating layer.

FIG. 10 is a flow chart illustrating a method 1000 of writing bits to magnetic memory 100 in an exemplary embodiment of the invention. In step 1002, control system 150 heats intermediate storage layer 142 to or above its Curie temperature, and heats data storage layer 112 just below its Curie temperature. Heating just below a Curie temperature refers to heating a layer to a temperature below its Curie temperature but high enough to allow the magnetization of the layer to be more easily influenced by magnetic fields. Heating intermediate storage layer 142 to or above its Curie temperature erases any magnetic domains in this layer so they will not affect data storage layer 112. Heating data storage layer 112 just below its Curie temperature allows write elements 104 to more easily write to this layer.

In step 1003, write elements 104 apply magnetic fields to data storage layer 112 to create or imprint a plurality of magnetic domains in data storage layer 112. The magnetic domains represent the bit pattern being written to data storage layer 112. In step 1004, control system 150 allows data storage layer 112 to cool which stores the magnetic domains in data storage layer 112. In step 1005, control system 150 then allows intermediate storage layer 142 to cool. As intermediate storage layer 142 cools, magnetic domains from data storage layer 112 or data storage layer 122 may be imprinted in the layer. Any magnetic domains in intermediate storage layer 142 should not affect the magnetic domains stored in data storage layer 112 as it has already cooled.

To copy the bits from data storage layer 112 to data storage layer 122, the following takes place. Control system 150 heats data storage layer 122 to or above its Curie temperature, and heats intermediate storage layer 142 just below its Curie temperature in step 1006. Heating data storage layer 122 to or above its Curie temperature erases any magnetic domains in this layer so they will not affect intermediate storage layer 142. Heating intermediate storage layer 142 just below its Curie temperature allows magnetic fields from the magnetic domains in data storage layer 112 to imprint the magnetic domains in intermediate storage layer 142. By imprinting the magnetic domains from data storage layer 112 to intermediate storage layer 142, the bits stored in data storage layer 112 are copied to intermediate storage layer 142 in the Z direction (upward in FIG. 9). In step 1007, control system 150 allows intermediate storage layer 142 to cool which stores the magnetic domains in intermediate storage layer 142. In step 1008, control system 150 then allows data storage layer 122 to cool.

Control system 150 then heats intermediate storage layer 152 to or above its Curie temperature, and heats data storage layer 122 just below its Curie temperature in step 1009. Heating intermediate storage layer 152 to or above its Curie temperature erases any magnetic domains in this layer so they will not affect data storage layer 122. Heating data storage layer 122 just below its Curie temperature allows magnetic fields from the magnetic domains in intermediate storage layer 142 to imprint the magnetic domains in data storage layer 122. By imprinting the magnetic domains from intermediate storage layer 142 to data storage layer 122, the bits stored in intermediate storage layer 142 are copied to data storage layer 122 in the Z direction (upward in FIG. 9). In step 1010, control system 150 allows data storage layer 122 to cool which stores the magnetic domains in data storage layer 122. In step 1011, control system 150 then allows intermediate storage layer 142 to cool. The bits have thus been successfully copied from data storage layer 112 to data storage layer 122 through intermediate storage layer 142. A similar method is used to copy the bits further up main column 101.

Control system 150 may erase the bits from data storage layer 112 if desired. To erase the bits, control system 150 heats intermediate storage layer 142 to or above its Curie temperature, and heats data storage layer 112 to or above its Curie temperature. Control system 150 allows data storage layer 112 to cool which returns data storage layer 112 to its primary or background magnetization. Control system 150 may heat and cool data storage layer 112 in the presence of a bias field in order to return data storage layer 112 to its primary or background magnetization. Control system 150 then allows intermediate storage layer 142 to cool. Again, as intermediate storage layer 142 cools, magnetic domains from data storage layer 122 may be imprinted in this layer. Any magnetic domains in intermediate storage layer 142 should not affect the magnetic domains stored in data storage layer 112 as it has already cooled.

Figure 11:
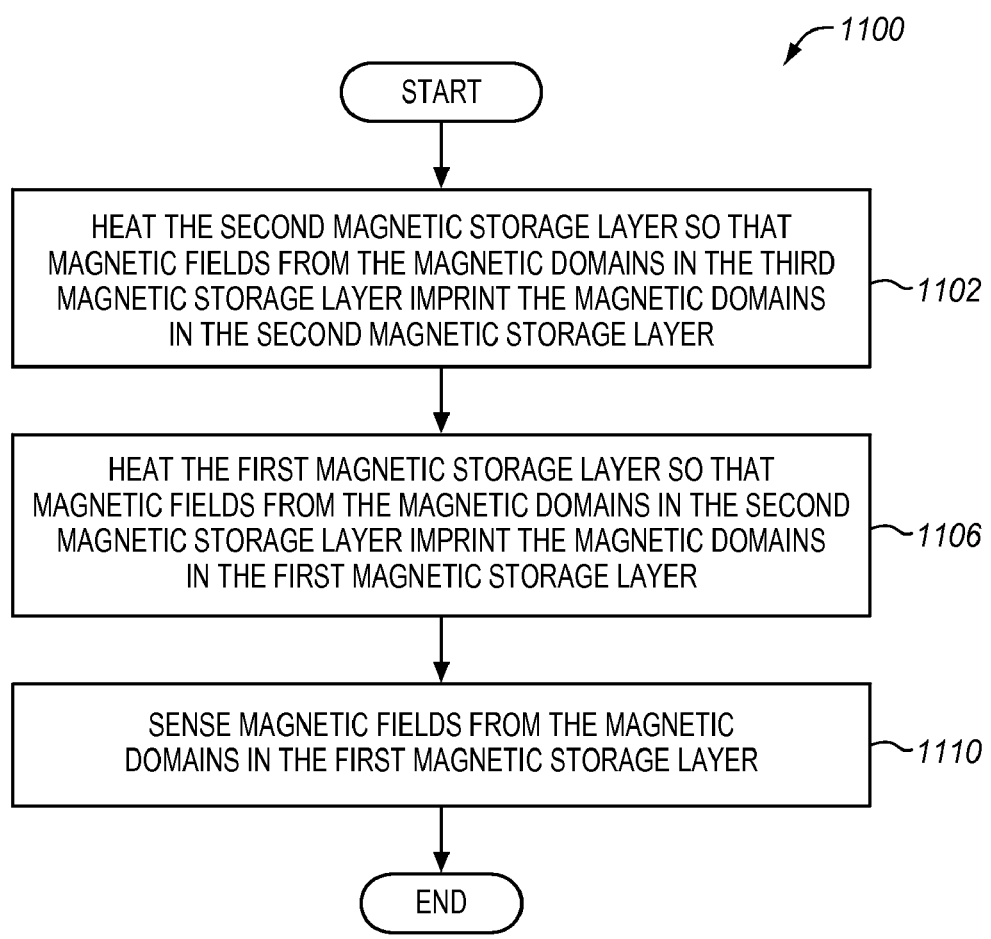
FIG. 11 is a flow chart illustrating a method of reading bits from the magnetic memory in an exemplary embodiment of the invention.

At some point, the bits stored in data storage layers 112, 122, or 132 are read from magnetic memory 100. FIG. 11 is a flow chart illustrating a method 1100 of reading bits from magnetic memory 100 in an exemplary embodiment of the invention. This embodiment illustrates reading bits stored in data storage layer 132, but a similar process may be used to read bits stored in other data storage layers. FIG. 12 illustrates magnetic memory 100 with the bits stored in data storage layer 132 in an exemplary embodiment. To read the bits in data storage layer 132, the bits need to be transferred down main column 101 to data storage layer 112 because data storage layer 112 is proximate to read elements 102. If other bit patterns are stored in data storage layer 112 or data storage layer 122, these bits patterns are read and temporarily off-loaded to an overflow storage system, which is described in FIG. 16.

In step 1102 of FIG. 11, control system 150 heats data storage layer 122 so that magnetic fields from the magnetic domains in data storage layer 132 imprint the magnetic domains in data storage layer 122. By imprinting the magnetic domains from data storage layer 132 to data storage layer 122, the bits stored in data storage layer 132 are copied to data storage layer 122 in the Z direction (downward in FIG. 12).

In step 1106, control system 150 heats data storage layer 112 so that magnetic fields from the magnetic domains in data storage layer 122 imprint the magnetic domains in data storage layer 112. By imprinting the magnetic domains from data storage layer 122 to data storage layer 112, the bits stored in data storage layer 122 are copied to data storage layer 112 in the Z direction. FIG. 13 illustrates magnetic memory 100 with the bits copied from data storage layer 132 to data storage layer 122 and from data storage layer 122 to data storage layer 112.

After copying bits from one data storage layer to another, control system 150 may erase the bits from the sending data storage layer. For instance, to erase bits from data storage layer 132, control system 150 may heat data storage layer 132 to or above its Curie temperature (Tc) to erase the magnetic domains and returns data storage layer 132 to its primary or background magnetization after it is cooled. Control system 150 may heat and cool data storage layer 132 in the presence of a bias field in order to return data storage layer 132 to its primary or background magnetization. The bits are thus erased from data storage layer 132.

With the bits transferred to data storage layer 112 that is proximate to read elements 102, the bits are in a position to be read by read elements 102. Read elements 102 sense magnetic fields from the magnetic domains in data storage layer 112 to read the bits from data storage layer 112 in step 1110. If read elements 102 are spin valves, for instance, the resistance of the spin valve will depend on the direction and magnitude of the field emanating from data storage layer 112. For example, upwardly-pointing magnetic fields from a magnetic domain will result in one value of resistance, while a downwardly-pointing magnetic field will result in a second resistance. An isolated magnetic domain thus results in one resistance, while the background magnetization, or no isolated domain, results in a second resistance.

Figure 14:
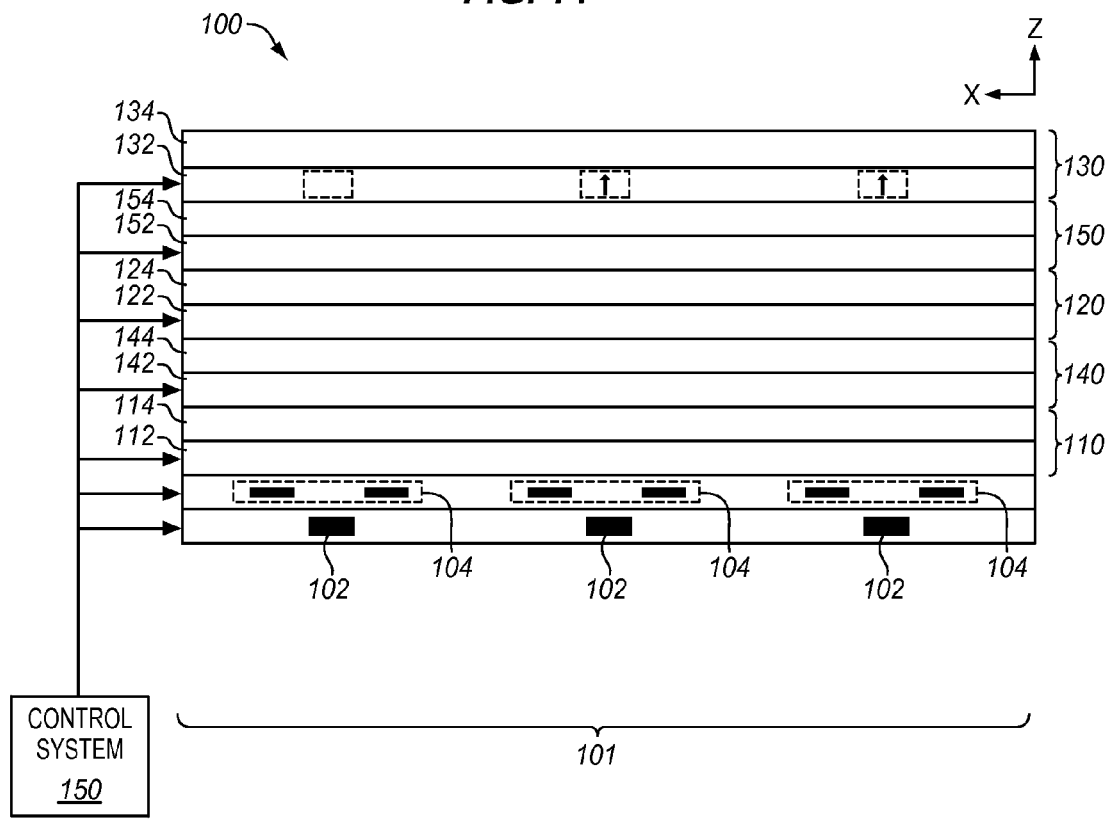
FIG. 14 illustrates a cross-sectional view of another embodiment of a magnetic memory where the magnetic memory also includes intermediate stacks.

FIG. 14 illustrates a cross-sectional view of another embodiment of magnetic memory 100 where magnetic memory 100 also includes intermediate stacks. This embodiment of magnetic memory 100 is also illustrated in FIG. 9. However, FIG. 14 shows a bit pattern stored in data storage layer 132 that needs to be copied down to data storage layer 112 to be read.

Figure 15:
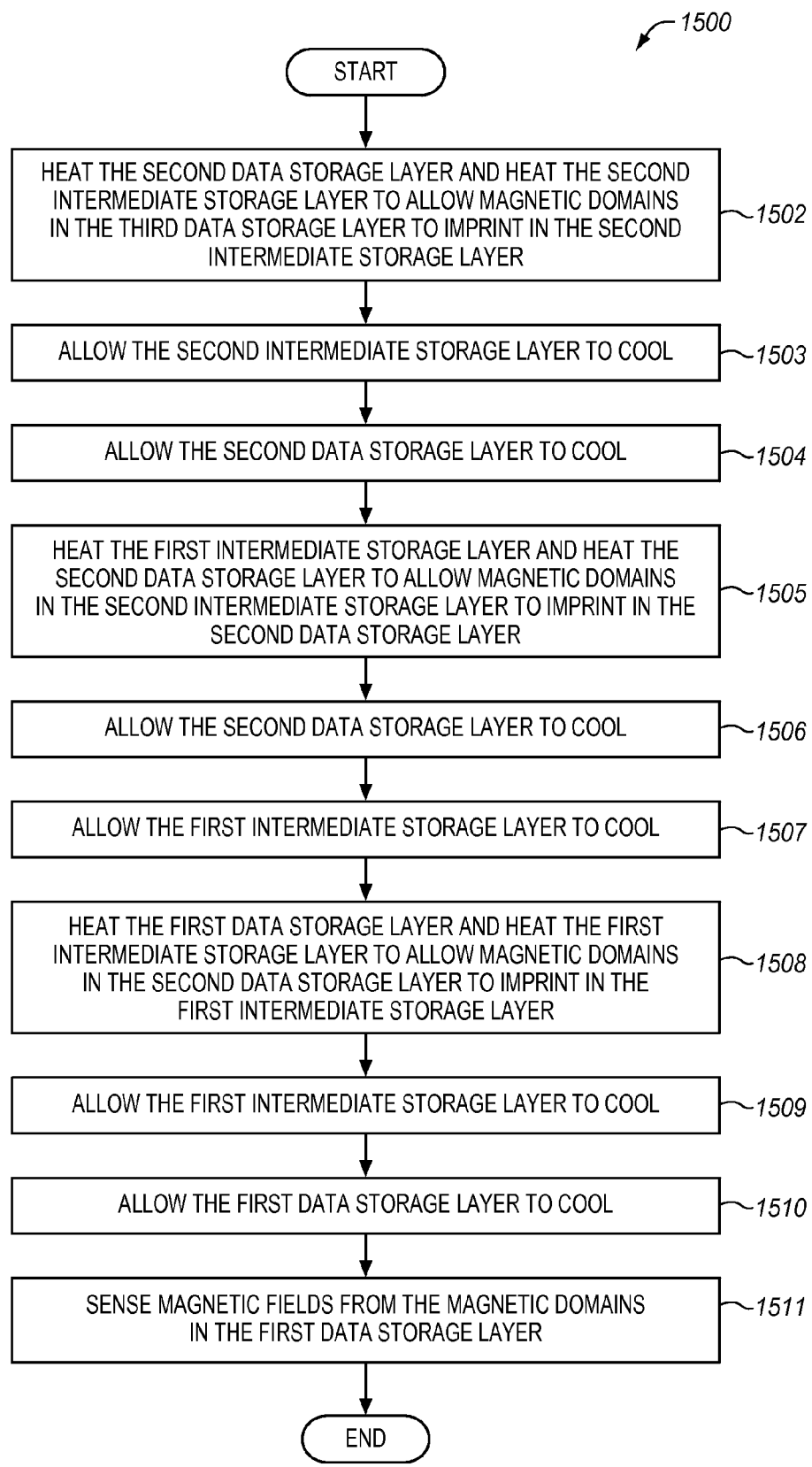
FIG. 15 is a flow chart illustrating a method of reading bits from a magnetic memory in an exemplary embodiment of the invention.

FIG. 15 is a flow chart illustrating a method 1500 of reading bits from magnetic memory 100 in an exemplary embodiment of the invention. In step 1502, control system 150 heats data storage layer 122 to or above its Curie temperature, and heats intermediate storage layer 152 just below its Curie temperature. Heating data storage layer 122 to or above its Curie temperature erases any magnetic domains in this layer so they will not affect intermediate storage layer 152. Heating intermediate storage layer 152 just below its Curie temperature allows magnetic fields from the magnetic domains in data storage layer 132 to imprint the magnetic domains in intermediate storage layer 152. By imprinting the magnetic domains from data storage layer 132 to intermediate storage layer 152, the bits stored in data storage layer 132 are copied to intermediate storage layer 152 in the Z direction (downward in FIG. 14). In step 1503, control system 150 allows intermediate storage layer 152 to cool which stores the magnetic domains in intermediate storage layer 152. In step 1504, control system 150 then allows data storage layer 122 to cool.

In step 1505, control system 150 heats intermediate storage layer 142 to or above its Curie temperature, and heats data storage layer 122 just below its Curie temperature in step 1505. Heating intermediate storage layer 142 to or above its Curie temperature erases any magnetic domains in this layer so they will not affect data storage layer 122. Heating data storage layer 122 just below its Curie temperature allows magnetic fields from the magnetic domains in intermediate storage layer 152 to imprint the magnetic domains in data storage layer 122. By imprinting the magnetic domains from intermediate storage layer 152 to data storage layer 122, the bits stored in intermediate storage layer 152 are copied to data storage layer 122 in the Z direction (downward in FIG. 14). In step 1506, control system 150 allows data storage layer 122 to cool which stores the magnetic domains in data storage layer 122. In step 1507, control system 150 then allows intermediate storage layer 142 to cool. The bits have thus been successfully copied from data storage layer 132 to data storage layer 122 through intermediate storage layer 152.

In step 1508, control system 150 heats data storage layer 112 to or above its Curie temperature, and heats intermediate storage layer 142 just below its Curie temperature. Heating data storage layer 112 to or above its Curie temperature erases any magnetic domains in this layer so they will not affect intermediate storage layer 142. Heating intermediate storage layer 142 just below its Curie temperature allows magnetic fields from the magnetic domains in data storage layer 122 to imprint the magnetic domains in intermediate storage layer 142. By imprinting the magnetic domains from data storage layer 122 to intermediate storage layer 142, the bits stored in data storage layer 122 are copied to intermediate storage layer 142 in the Z direction (downward in FIG. 14). In step 1509, control system 150 allows intermediate storage layer 142 to cool which stores the magnetic domains in intermediate storage layer 142. In step 1510, control system 150 then allows data storage layer 112 to cool. As data storage layer 112 cools, magnetic fields from the magnetic domains in intermediate storage layer 142 to imprint the magnetic domains in data storage layer 112. By imprinting the magnetic domains from intermediate storage layer 142 to data storage layer 112, the bits stored in intermediate storage layer 142 are copied to data storage layer 112 in the Z direction (downward in FIG. 14).

With the bits transferred to data storage layer 112 that is proximate to read elements 102, the bits are in a position to be read by read elements 102. Read elements 102 sense magnetic fields from the magnetic domains in data storage layer 112 to read the bits from data storage layer 112 in step 1511.

As previously stated, if a bit pattern in data storage layer 132 is to be read and another bit pattern is being simultaneously stored in data storage layer 122, then control system 150 needs to move the bit pattern stored in the data storage layers below data storage layer 132 so that the bits stored in data storage layer 132 can be transferred to data storage layer 112. To provide a location to temporarily store the bit pattern from data storage layer 122 and other data storage layers, magnetic memory 100 may further include an overflow storage system according to features and aspects herein.

Figure 16:
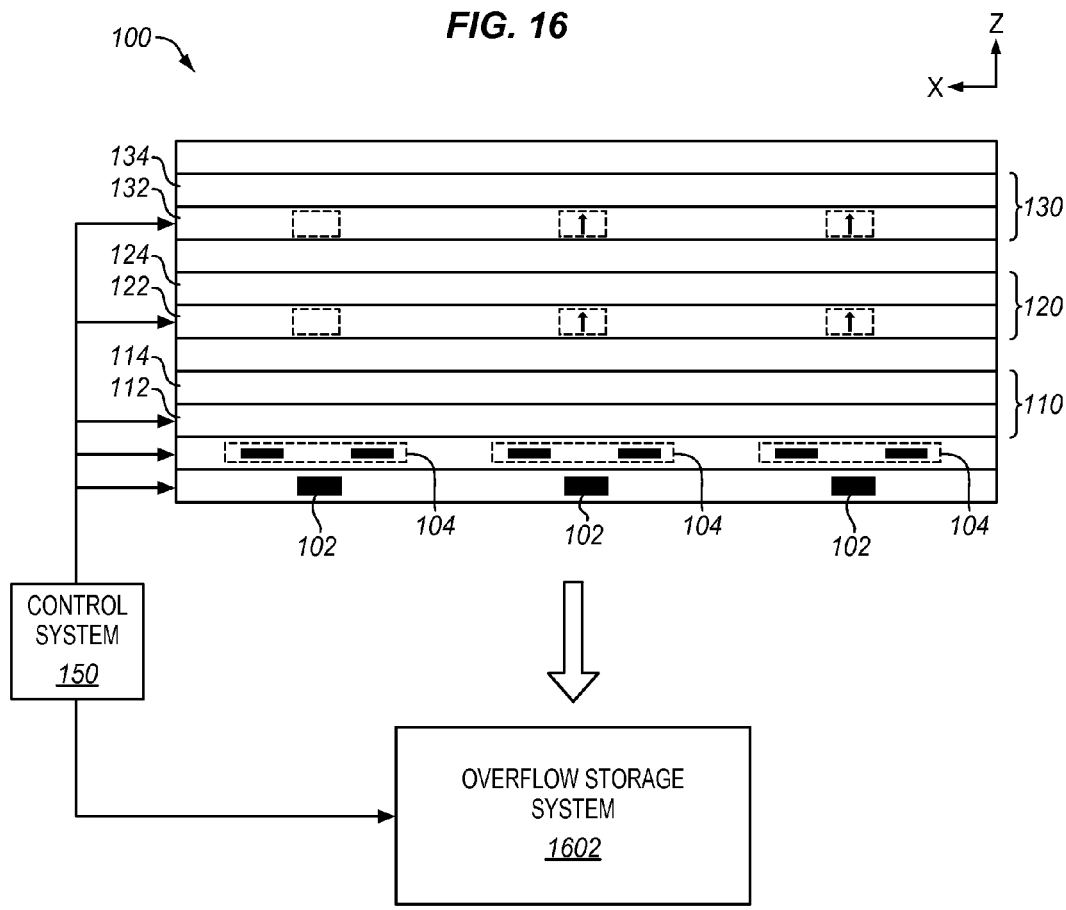
FIG. 16 illustrates the magnetic memory that includes an overflow storage system in an exemplary embodiment of the invention.

FIG. 16 illustrates magnetic memory 100 that includes an overflow storage system 1602. Overflow storage system 1602 may comprise any desired memory adapted to store the bits read from data storage layer 112. Overflow storage system 1602 may include one or more storage stacks much like storage stacks 110, 120, and 130. Overflow storage system 1602 may serve a single column of magnetic memory 100 shown in FIG. 16, or may serve multiple columns of magnetic memory 100 which are not shown. As illustrated in FIG. 16, both data storage layer 122 and data storage layer 132 are storing bits. Data storage layer 122 stores a first bit pattern and data storage layer 132 stores a second bit pattern. If a request is received in magnetic memory 100 for the bits stored in data storage layer 132, then control system 150 operates as described in FIG. 11 to move the first bit pattern in data storage layer 122 to overflow storage system 1602. Control system 150 also operates as described in FIG. 11 to move the second bit pattern in data storage layer 132 to data storage layer 112 and to read the bits from data storage layer 112. After the second bit pattern previously stored in data storage layer 132 has been read, control system 150 may write the first bit pattern being stored in overflow storage system 1602 back onto data storage layer 122 or another data storage layer in magnetic memory 100.

Figure 17:
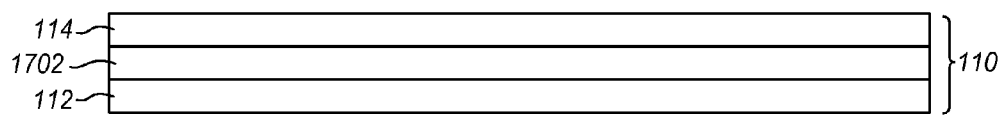
FIG. 17 illustrates a storage stack that includes a heating layer in an exemplary embodiment of the invention.

As previously stated, storage stacks 110, 120, and 130 may each include a heating layer adapted to heat the corresponding data storage layer in the storage stack. FIG. 17 illustrates storage stack 110 that includes a heating layer. In this embodiment, storage stack 110 includes heating layer 1702, data storage layer 112, and insulating layer 114. Heating layer 1702 is adapted to heat data storage layer 112 responsive to a current provided by control system 150 (see FIG. 1). Heating layer 1702 may comprise a semiconductor or metallic layer having a resistance sufficient to heat data storage layer 112 responsive to an electrical current. When heating layer 1702 heats data storage layer 112, insulating layer 114 is adapted to insulate the heat from other data storage layers.

Figure 18:
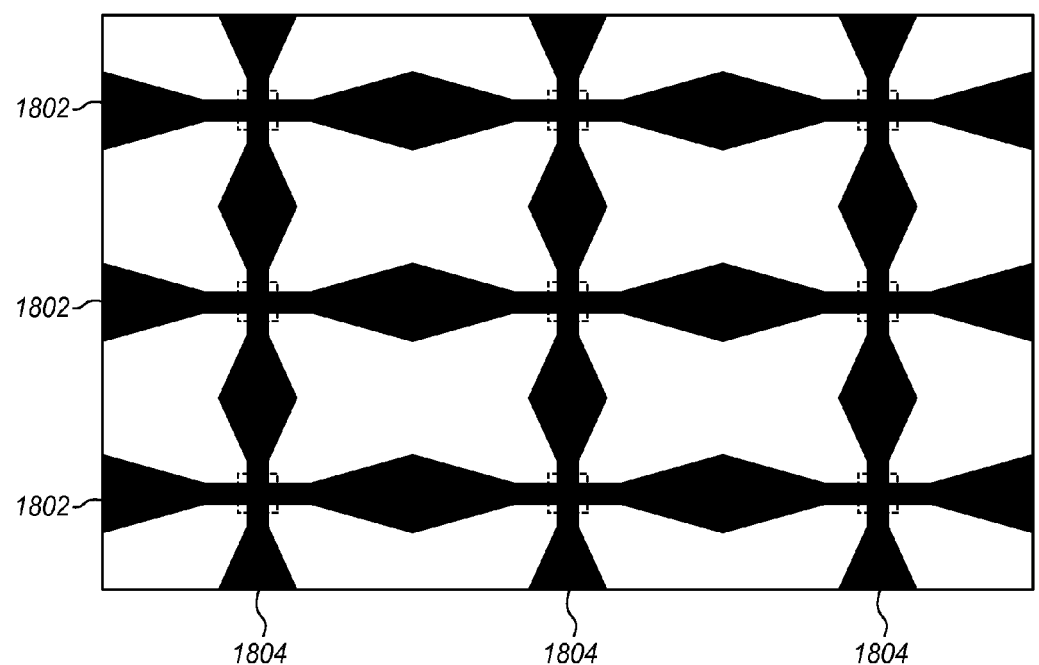
FIG. 18 is a top view of a heating layer comprising cross-hatched conductors in an exemplary embodiment of the invention.

Heating layer 1702 may comprise cross-hatched conductors. FIG. 18 is a top view of a heating layer 1702 comprising cross-hatched conductors. The horizontal conductors 1802 and the vertical conductors 1804 in FIG. 18 intersect at a plurality of points. The intersection points of the conductors 1802, 1804 correspond with the locations of the magnetic domains in data storage layer 112 (i.e., the locations where bits are stored). In this embodiment, conductors 1802, 1804 are not uniform in width. The widths of conductors 1802, 1804 are narrower at the intersection points (i.e., the bit locations) as compared to the widths of conductors 1802, 1804 between the intersection points. With conductors 1802, 1804 narrower at the intersections points, the power dissipation is higher which results in higher temperatures at the intersections points. With conductors 1802, 1804 wider between the intersections points, the power dissipation is lower which results in lower temperatures between the intersections points. One advantage of this configuration is that less power is consumed as higher temperatures are only provided at the intersections points. Another advantage is that higher thermal gradients can be acquired in data storage layer 112 along the lengths on the conductors 1802, 1804 because the regions in data storage layer 112 between the bit locations remain cooler. Another advantage is faster cooling time as a smaller volume of data storage layer 112 is heated and thus cooled. Another advantage is that the resistance of the wires can be lower as the average width of the conductors 1802, 1804 is larger.

In other embodiments, heating layer 1702 does not comprise cross-hatched conductors, but comprises either horizontal conductors 1802 or vertical conductors 1804. The horizontal conductors 1802 or the vertical conductors 1804 may be narrower at locations that correspond with the locations of the magnetic domains in data storage layer 112 (i.e., the locations where bits are stored).

Referring back to FIG. 5, magnetic domains 502 may grow larger when being transferred from one data storage layer to another. The magnetic fields from the magnetic domains 502 are not perfectly perpendicular and tend to diverge at the domain walls. Due to this occurrence, the magnetic domains can grow in size when being transferred to successive data storage layers which can affect the overall density of the magnetic memory 100 (see FIG. 1). According to features and aspects herein, the data storage layers in magnetic memory 100 can be patterned in one embodiment to control the size of the magnetic domains.

FIG. 19 illustrates data storage layer 112 as patterned in an exemplary embodiment of the invention. Data storage layer 112 is patterned into strips in this embodiment. The locations of the strips correspond with the magnetic domains in data storage layer 112. The width of the strips corresponds with a desired size of the magnetic domains. For instance, if the desired width of the magnetic domains is 1 micron, then the width of the strips may be 1.2 microns. Because the magnetic domains are able to spread along the length of the strips in data storage layer 112 (which is up and down in FIG. 19), the next data storage layer in the stack of magnetic memory 100, which is data storage layer 122, may also be patterned into strips that are orthogonal to the strips of data storage layer 112.

FIG. 20 illustrates data storage layer 122 as patterned in an exemplary embodiment of the invention. Data storage layer 122 is also patterned into strips similar to data storage layer 112. However, the strips of data storage layer 122 are orthogonal to the strips in data storage layer 112. The magnetic domains are able to spread along the length of the strip (which is left to right in FIG. 20), but the magnetic domains are controlled in those directions by the previous orthogonal strips. By making the strips of the subsequent data storage layer orthogonal to the previous data storage layer, the spread of the magnetic domains can be controlled in all directions. If data storage layer 132 in FIG. 1 is patterned into strips, then the strips would again be orthogonal to the strips in data storage layer 122.

Figure 32:
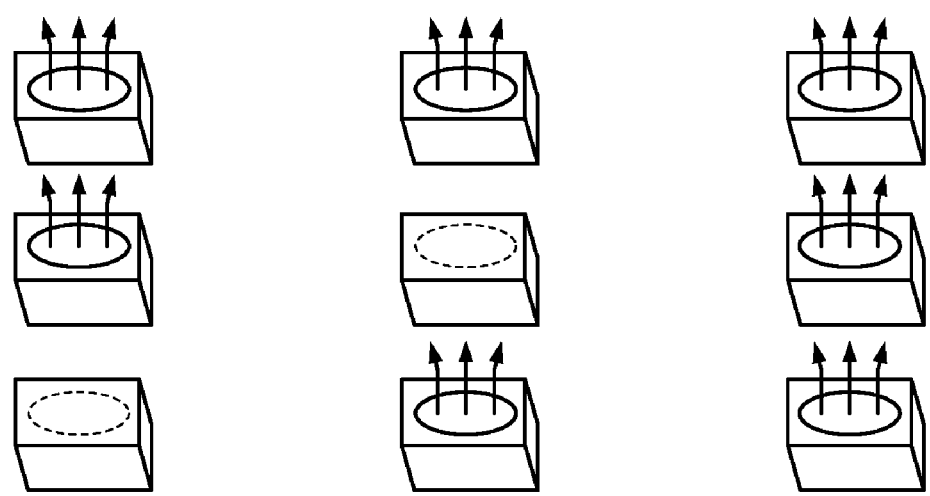
FIG. 32 illustrates the first data storage layer as patterned in another exemplary embodiment of the invention.

Data storage layers may be patterned into different shapes other than strips. For instance, a data storage layer may be patterned into domain "islands", which is a section of material having a size of a desired magnetic domain. FIG. 32 illustrates data storage layer 112 as patterned in another exemplary embodiment of the invention. Data storage layer 112 is patterned into domain-sized islands in this embodiment. The locations of the islands correspond with the magnetic domains in data storage layer 112. The area of the islands corresponds with a desired size of the magnetic domains. The next data storage layer in the stack of magnetic memory 100, which is data storage layer 122, may also be patterned into similar islands.

FIG. 21 is a flow chart illustrating a method 2100 of fabricating a magnetic memory in an exemplary embodiment of the invention. Method 2100 may be used to fabricate magnetic memory 100 illustrated in the previous figures. Step 2102 comprises forming a plurality of read elements and a plurality of write elements. The read element may be formed in a first layer and the write elements may be formed in one or more other layers. For instance, the read elements may comprise an array of Hall Effect elements, spin valve elements, or tunnel valve elements. The write elements may comprise a plurality of current loops that correspond with the read elements. Step 2104 comprises forming a first storage stack proximate to the plurality of read elements and the plurality of write elements. The first storage stack includes a first data storage layer defining a first plane. The first data storage layer may be comprised of magnetic material, such as TbFeCo or CoPt multilayers. Step 2106 comprises forming a second storage stack proximate to the first storage stack. The second storage stack includes a second data storage layer defining a second plane that is parallel to the first plane.

The write elements as formed in step 2102 are adapted to apply magnetic fields to the first data storage layer to create a plurality of magnetic domains in the first data storage layer representing a plurality of bits in the first data storage layer. The second data storage layer as formed in step 2106 is responsive to heat and magnetic fields from the magnetic domains in the first data storage layer to replicate the magnetic domains from the first data storage layer. The first data storage layer as formed in step 2104 is responsive to heat to erase the magnetic domains.

Method 2100 in FIG. 21 may further comprise step 2108 that comprises forming a third storage stack proximate to the second storage stack. The third storage stack includes a third data storage layer defining a third plane that is parallel to the first plane and the second plane. The third data storage layer as formed in step 2108 is responsive to heat and magnetic fields from the magnetic domains in the second data storage layer to replicate the magnetic domains from the second data storage layer. The second data storage layer as formed in step 2106 is further responsive to heat to erase the magnetic domains. Method 2100 may include other steps to form a fourth storage stack, a fifth storage stack, etc. The data storage layers are further responsive to heat to allow magnetic domains to transfer bits the other direction between the data storage layers. Method 2100 may also include the further steps of forming intermediate stacks as shown in FIG. 9 between the storage stacks.

FIG. 22 is a flow chart illustrating a method 2200 of fabricating a storage stack, such as storage stack 120 in FIG. 1, in an exemplary embodiment of the invention. Step 2202 comprises forming a data storage layer. Step 2204 comprises forming a heating layer proximate to the data storage layer. Step 2206 comprises forming an insulating layer proximate to the heating layer. Method 2200 may also be used to form intermediate stacks as described herein.

FIG. 23 is a flow chart illustrating a method 2300 of patterning a data storage layer in an exemplary embodiment of the invention. Step 2302 comprises patterning a first data storage layer into strips. The patterning step may comprise forming photo-resist on a full film of the first data storage layer, and performing lift-off to form the strips. Alternatively, the magnetic film can be etched or milled to form the strips. As previously discussed, the first data storage layer is adapted to store bits in the form of magnetic domains. The locations of the strips correspond with the magnetic domains in the first data storage layer. The width of the strips corresponds with a desired size of the magnetic domains. For instance, if the desired width of the magnetic domains is 1 micron, then the width of the strips may be 1.2 microns.

Step 2304 comprises patterning the second data storage layer into strips. Once again, the patterning step may comprise forming photo-resist on a full film of the second data storage layer, and performing lift-off, milling, or etching to form the strips. The strips of the second data storage layer are orthogonal to the strips of the first data storage layer. By having the strips orthogonal in successive strips of data storage layers, the size of a magnetic domain can advantageously be controlled. Method 2300 may include other steps of patterning successive data storage layers into strips that are orthogonal to the strips of the previous data storage layer.

EXAMPLE

FIG. 24 is a cross-sectional view of a more detailed embodiment of a magnetic memory 2400 in an exemplary embodiment of the invention. Magnetic memory 2400 comprises a three-dimensional solid state memory. The cross-sectional view in FIG. 24 only shows a portion of magnetic memory 2400, as an actual magnetic memory may extend further in the X-Y direction. Magnetic memory 2400 includes a main column 2401 of layers comprising an array of read elements 2402, a cross-point array of current loops 2404, a plurality of storage stacks 2410, 2430, 2450, and 2470, a plurality of intermediate stacks 2420, 2440, and 2460, and a control system 2480. Storage stacks 2410, 2430, 2450, and 2470 are used for actual storage of bits, while intermediate stacks 2420, 2440, and 2460 are used as a buffer between storage stacks 2410, 2430, 2450, and 2470. Storage stack 2410 is formed proximate to the array of read elements 2402 and the cross-point array of current loops 2404. Intermediate stack 2420 is formed proximate to storage stack 2410. Storage stack 2430 is formed proximate to intermediate stack 2420. Intermediate stack 2440 is formed proximate to storage stack 2430. Storage stack 2450 is formed proximate to intermediate stack 2440. Intermediate stack 2460 is formed proximate to storage stack 2450. Storage stack 2470 is formed proximate to intermediate stack 2460. Magnetic memory 2400 may include n storage stacks and n intermediate stacks as desired.

Each storage stack 2410, 2430, 2450, and 2470 includes a data storage layer, a heating layer, and an insulating later. The data storage layers comprise perpendicular media type layers, such as TbFeCo or CoPt multi-layers with a typical Mr in the 300-500 emu/cc range. The data storage layers also have a Curie temperature designed to be around 200° C. The heating layers comprise any resistive material adapted to increase in temperature responsive to the application of an electrical current. The insulating layers comprise any thermally insulating material that confines heat to the data storage layer in its corresponding storage stack.

Each intermediate stack 2420, 2440, and 2460 includes similar layers to a storage stack, that being a data storage layer, a heating layer, and an insulating later.

The following describes a write operation in magnetic memory 2400. To start, the magnetization direction of data storage layer 2412 is set in a uniform direction, which is the background direction. This can be achieved by applying a current to all of the write loops 2404 and heating data storage layer 2412 to close to or above its Curie temperature (Tc). Alternatively, a large current loop could be formed below storage stack 2410 to provide a bias field to data storage layer 2412, which will magnetize data storage layer 2412 when heated.

To start writing data, a page of bits is written into storage stack 2410. A page of bits comprises any number of bits, such as 4 kbits, 8 kbits, etc. To write the page of bits into storage stack 2410, control system 2480 applies an electrical current to heating layer 2413, which causes heating layer 2413 to rise in temperature. The heat from heating layer 2413 in turn raises the temperature of data storage layer 2412 so that the magnetization of data storage layer 2412 is more easily changed responsive to an external magnetic field. In other words, the heating lowers the coercive field and/or Hk of data storage layer 2412 making imprinting of a magnetic domain energetically favorable. Insulating layer 2414 insulates heat from heating layer 2413 from affecting the other data storage layers formed above in the column 2401.

To ensure that any domains present in the data storage layer 2422 of intermediate stack 2420 do not influence the writing of the data storage layer 2412 of storage stack 2410, control system 2480 applies an electrical current to heating layer 2423 which causes heating layer 2423 to rise in temperature above its Curie temperature (Tc) to erase any magnetic domains in this layer. Control system 2480 then energizes the cross-point array of current loops 2404 to write the bits to specific locations in data storage layer 2412. The current loops 2404 generate magnetic fields that are opposite to the normal magnetization of data storage layer 2412. The magnetic fields from the current loops 2404, such as magnetic fields of about 500 Oe, change the magnetization in specific locations in data storage layer 2412 to create magnetic domains. The magnetic domains represent the bits in data storage layer 2412. The heating of data storage layer 2412 allows for the magnetic fields to more easily change the magnetization of data storage layer 2412 and create the magnetic domains.

Figure 25:
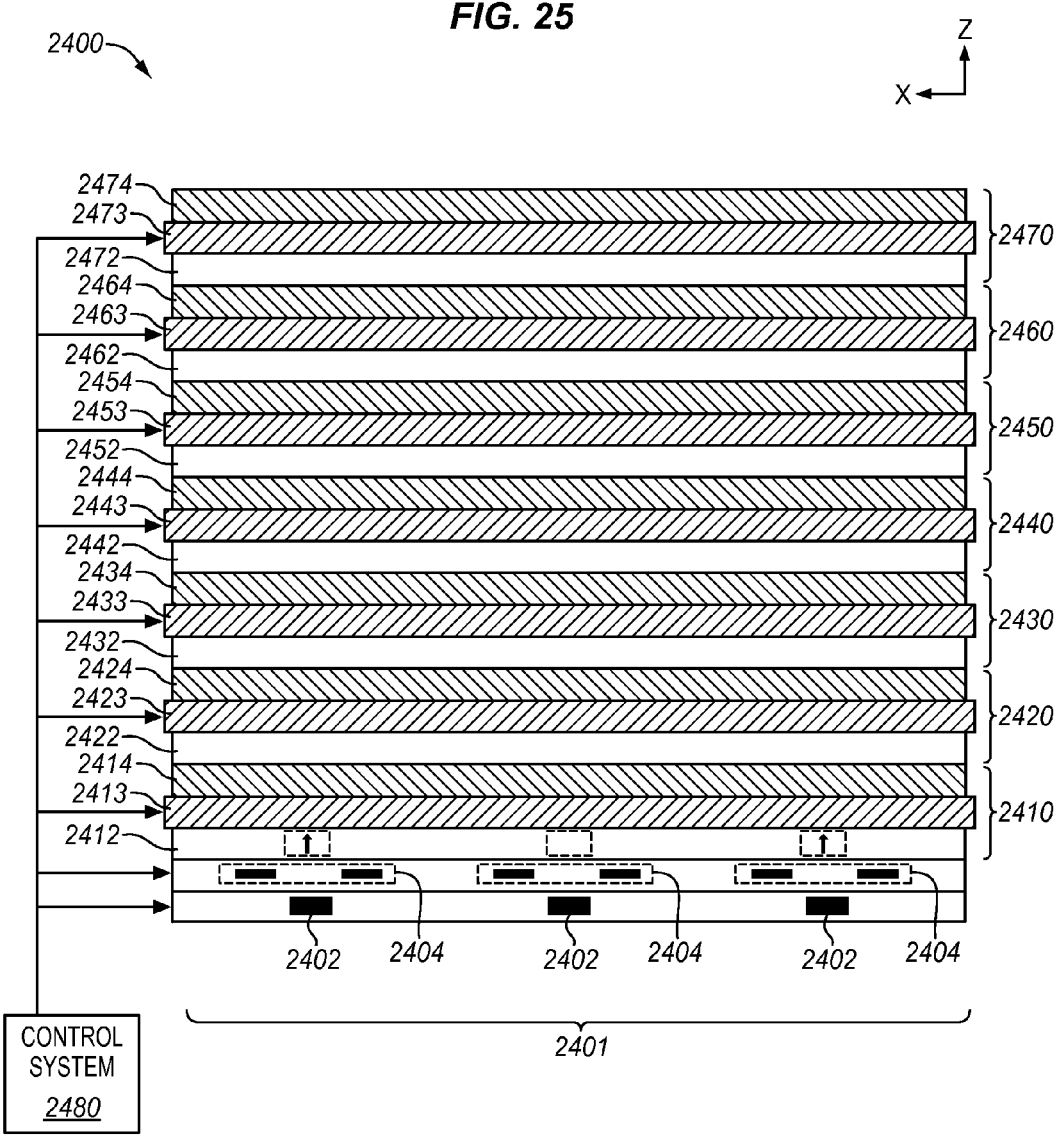
FIG. 25 illustrates the magnetic memory of FIG. 24 with a page of bits written into a first data storage layer in an exemplary embodiment of the invention.

When the magnetic domains are written into data storage layer 2412, control system 2480 stops applying the electrical current to heating layer 2413 to allow data storage layer 2412 to cool with the magnetic domains imprinted and stops applying current to the array of current loops 2404. After data storage layer 2412 has cooled sufficiently, control system 2480 stops applying current to heating layer 2423 to allow data storage layer 2422 to cool. FIG. 25 illustrates magnetic memory 2400 with bits written into data storage layer 2412 in an exemplary embodiment. The magnetic domains representing the bits are indicated by a single arrow pointing upward in a dotted box. The absence of a magnetic domain is illustrated by an empty dotted box. When data storage layer 2422 is cooled, it may be imprinted with magnetic domains from either data storage layer 2412 or data storage layer 2432, which is not shown in FIG. 25.

Bits may be written to data storage layer 2412 in an alternative manner. First, control system 2480 may apply an electrical current to heating layer 2413 and heating layer 2423. Control system 2480 may then energize the cross-point array of current loops 2404 to write the upwardly-pointing bits. Control system 2480 may then energize the cross-point array of current loops 2404 through a reverse current to write the downwardly-pointing bits. When the magnetic domains are written into data storage layer 2412, control system 2480 stops applying the electrical current to heating layer 2413 to allow data storage layer 2412 to cool with the magnetic domains imprinted. After data storage layer 2412 has cooled sufficiently, control system 2480 stops applying current to heating layer 2423 to allow data storage layer 2422 to cool.

Control system 2480 may transfer the page of bits stored in data storage layer 2412 upwardly in main column 2401 to other storage stacks if desired. To transfer the page of bits up main column 2401, control system 2480 applies an electrical current to heating layer 2433 to heat data storage layer 2432 above its Curie temperature to erase any magnetic domains in this layer. Control system 2480 also applies an electrical current to heating layer 2423 to heat data storage layer 2422 just below its Curie temperature. When heating data storage layer 2422, magnetic fields from the magnetic domains in data storage layer 2412 imprint or replicate the magnetic domains in data storage layer 2422.

Figure 26:
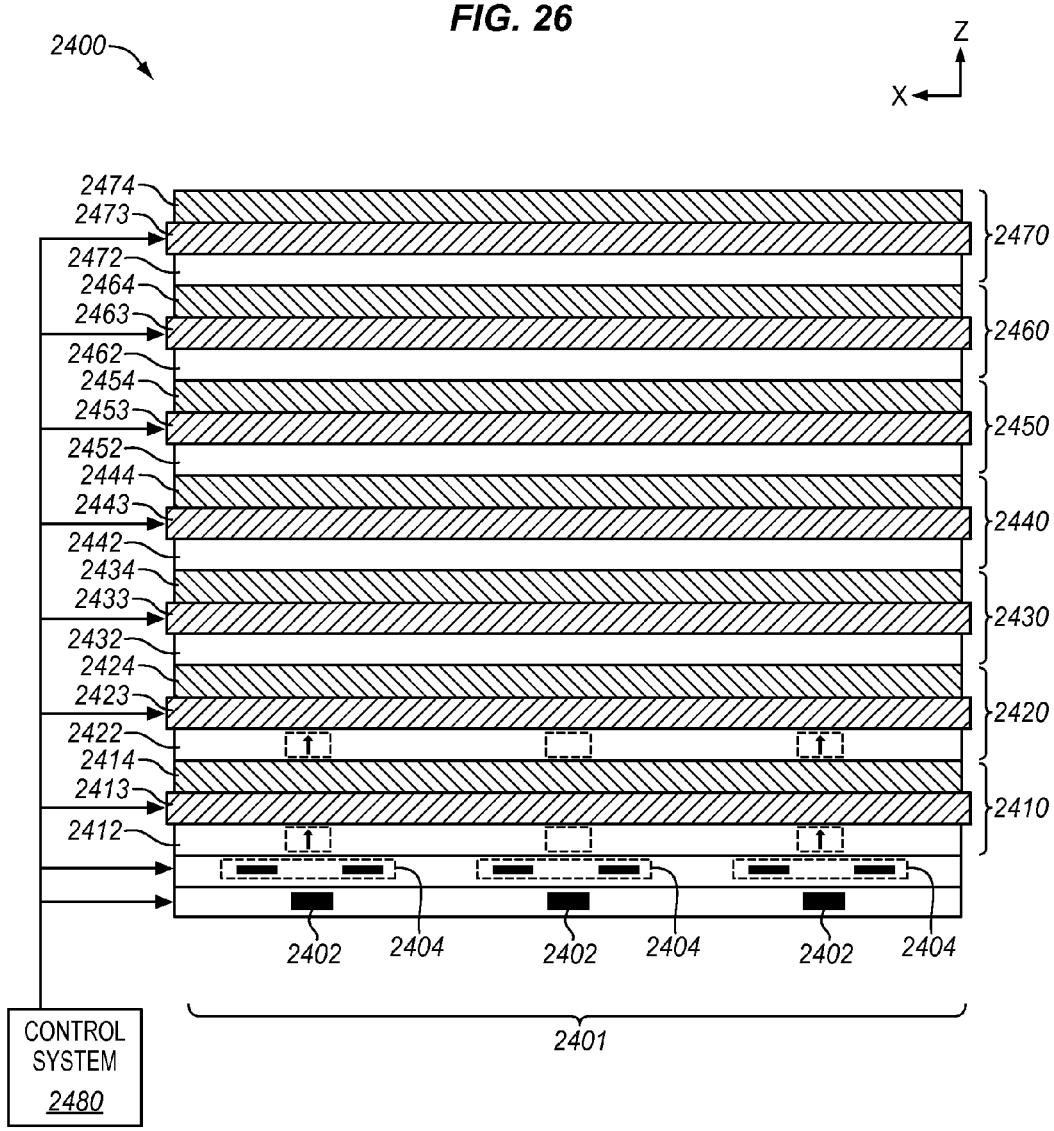
FIG. 26 illustrates the magnetic memory of FIG. 24 with the page of bits imprinted into a second data storage layer in an exemplary embodiment of the invention.

When the magnetic domains are imprinted in data storage layer 2422, control system 2480 stops applying the electrical current to heating layer 2423 to allow data storage layer 2422 to cool. Control system 2480 then stops applying the electrical current to heating layer 2433 to allow data storage layer 2432 to cool. FIG. 26 illustrates magnetic memory 2400 with bits imprinted into data storage layer 2422 in an exemplary embodiment. When data storage layer 2432 is cooled, it may be imprinted with magnetic domains from either data storage layer 2422 or data storage layer 2442, which is not shown in FIG. 26.

Data storage layer 2422 is an intermediate layer in this embodiment, so control system 2480 transfers the page of bits stored in data storage layer 2422 further upward in main column 2401 to the next storage stack. Control system 2480 applies an electrical current to heating layer 2443 to heat data storage layer 2442 above its Curie temperature to erase any magnetic domains in this layer. Control system 2480 also applies an electrical current to heating layer 2433 to heat data storage layer 2432 just below its Curie temperature. When heating data storage layer 2432, magnetic fields from the magnetic domains in data storage layer 2422 imprint or replicate the magnetic domains in data storage layer 2432.

Figure 27:
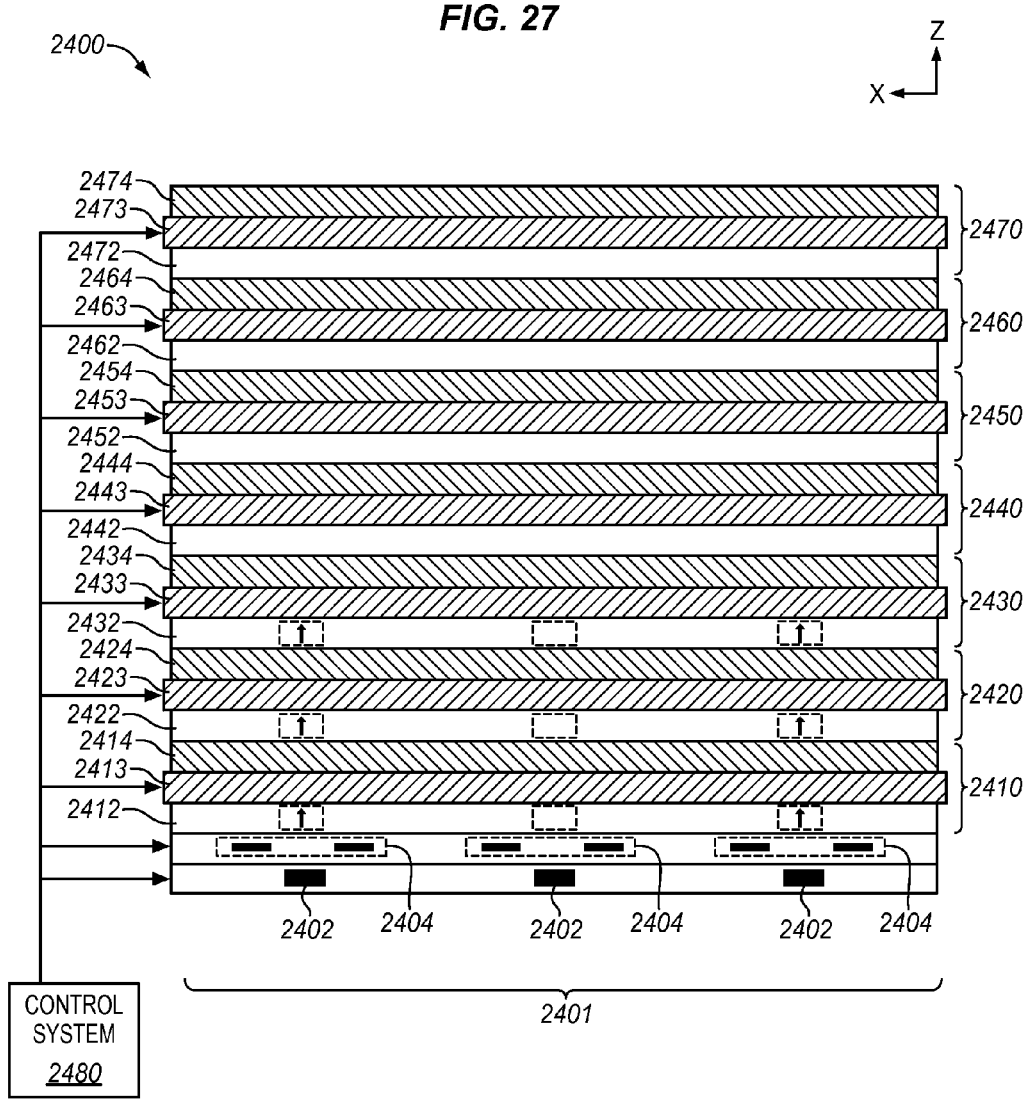
FIG. 27 illustrates the magnetic memory of FIG. 24 with the page of bits written into a third data storage layer in an exemplary embodiment of the invention.

When the magnetic domains are written into data storage layer 2432, control system 2480 stops applying the electrical current to heating layer 2433 first to allow data storage layer 2432 to cool. Control system 2480 then stops applying the electrical current to heating layer 2443 to allow data storage layer 2442 to cool. FIG. 27 illustrates magnetic memory 2400 with bits written into data storage layer 2432 in an exemplary embodiment. When data storage layer 2442 is cooled, it may be imprinted with magnetic domains from either data storage layer 2432 or data storage layer 2452, which is not shown in FIG. 27.

Figure 28:
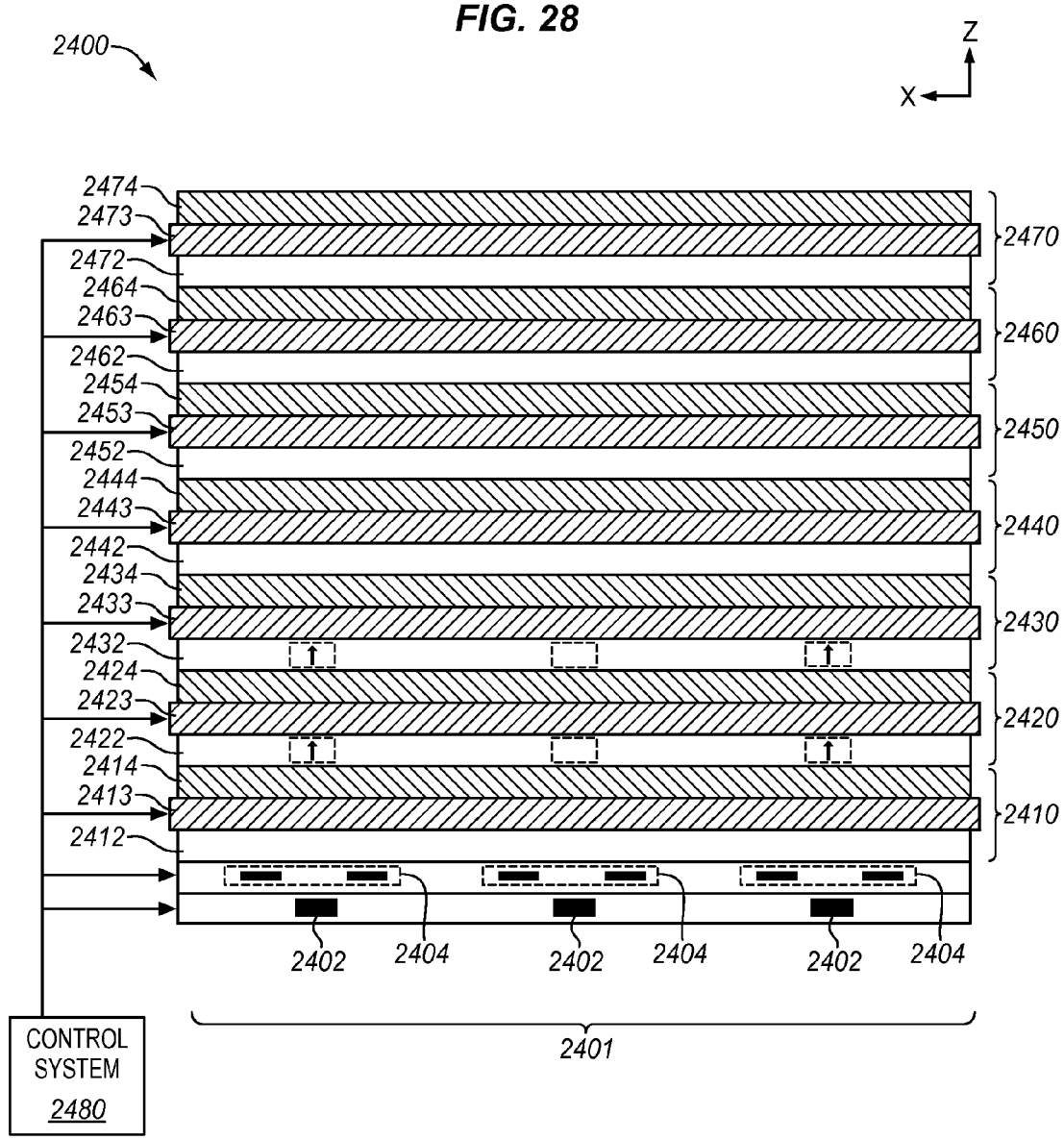
FIG. 28 illustrates the magnetic memory of FIG. 24 with the page of bits erased from the first data storage layer in an exemplary embodiment of the invention.

Data storage layer 2432 is an actual storage layer where the page of bits may be stored. With the page of bits transferred to data storage layer 2432, control system 2480 may erase the page of bits from data storage layer 2412, although it is not necessary. To erase the bits, control system 2480 applies current to heating layer 2413 and heating layer 2423 to heat data storage layer 2412 and data storage layer 2422, respectively, above their Curie temperature. Heating these data storage layers 2412 and 2422 above their Curie temperatures in effect erases the magnetic domains and consequently the bits from these layers. Control system 2480 stops applying the electrical current to heating layer 2413 first to allow data storage layer 2412 to cool. Data storage layer 2412 cools in the absence of magnetic fields, and thus the bits are erased from this layer. Control system 2480 then stops applying the electrical current to heating layer 2423 to allow data storage layer 2422 to cool. The magnetic domains in data storage layer 2432 will imprint back into data storage layer 2422 while data storage layer 2422 is cooled. However, the magnetic domains will not again imprint in data storage layer 2412 because this layer has already cooled. FIG. 28 illustrates magnetic memory 2400 with bits erased from data storage layer 2412 in an exemplary embodiment.

Control system 2480 may transfer the page of bits stored in data storage layer 2432 further upward in the stack to other storage stacks if desired. To transfer the page of bits up the stack, control system 2480 applies an electrical current to heating layer 2453 to heat data storage layer 2452 above its Curie temperature to erase any magnetic domains in this layer. Control system 2480 also applies an electrical current to heating layer 2443 to heat data storage layer 2442 just below its Curie temperature. When heating data storage layer 2442, magnetic fields from the magnetic domains in data storage layer 2432 imprint or replicate the magnetic domains in data storage layer 2442.

Figure 29:
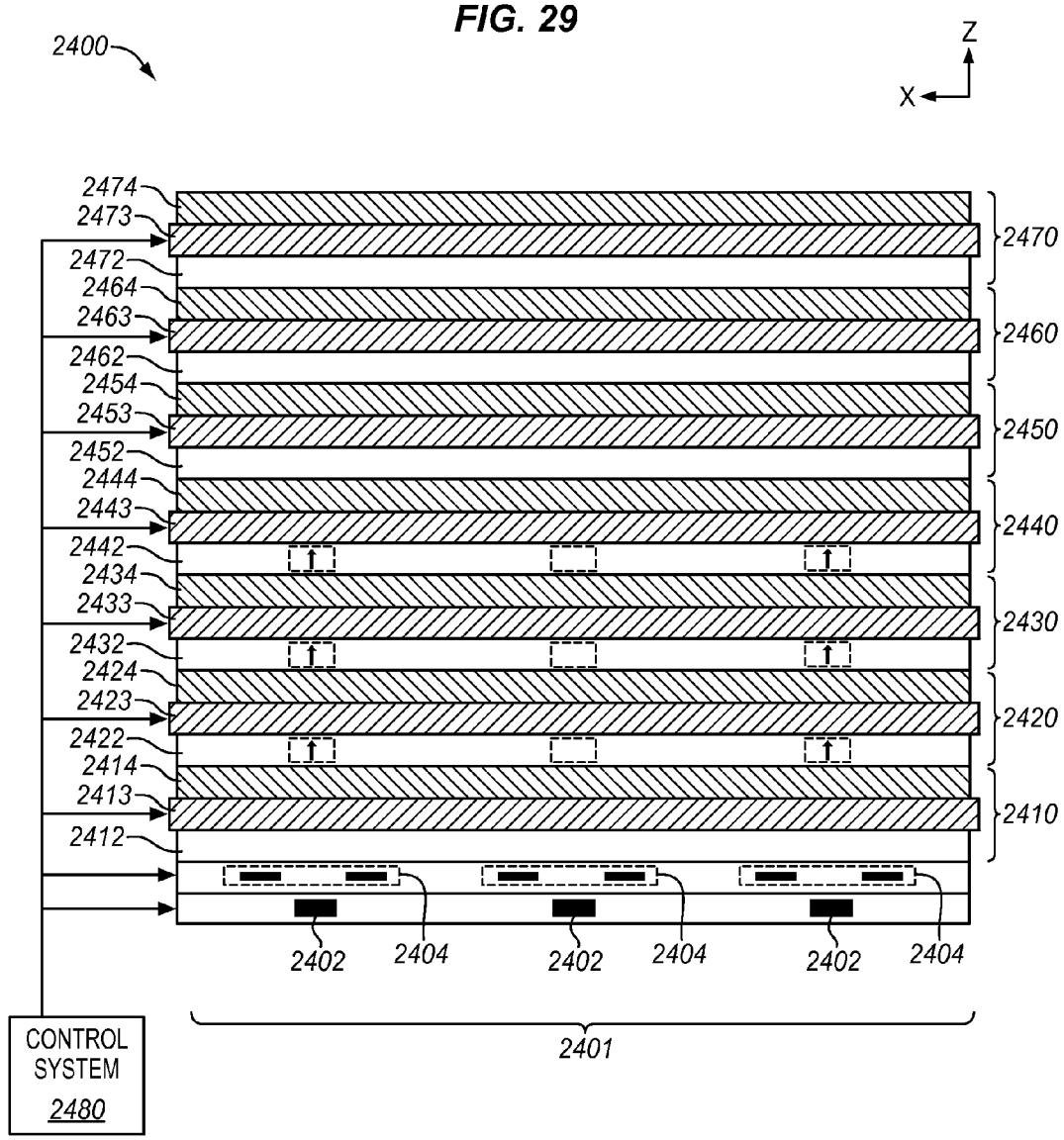
FIG. 29 illustrates the magnetic memory of FIG. 24 with the page of bits written into a fourth data storage layer in an exemplary embodiment of the invention.

When the magnetic domains are written into data storage layer 2442, control system 2480 stops applying the electrical current to heating layer 2443 first to allow data storage layer 2442 to cool. Control system 2480 then stops applying the electrical current to heating layer 2453 to allow data storage layer 2452 to cool. FIG. 29 illustrates magnetic memory 2400 with bits written into data storage layer 2442 in an exemplary embodiment. When data storage layer 2452 is cooled, it may be imprinted with magnetic domains from either data storage layer 2442 or data storage layer 2462, which is not shown in FIG. 29.

Data storage layer 2442 is an intermediate layer in this embodiment, so control system 2480 transfers the page of bits stored in data storage layer 2442 further upward in main column 2401 to the next storage stack. Control system 2480 applies an electrical current to heating layer 2463 to heat data storage layer 2462 above its Curie temperature to erase any magnetic domains in this layer. Control system 2480 also applies an electrical current to heating layer 2453 to heat data storage layer 2452 just below its Curie temperature. When heating data storage layer 2452, magnetic fields from the magnetic domains in data storage layer 2442 imprint or replicate the magnetic domains in data storage layer 2452.

Figure 30:
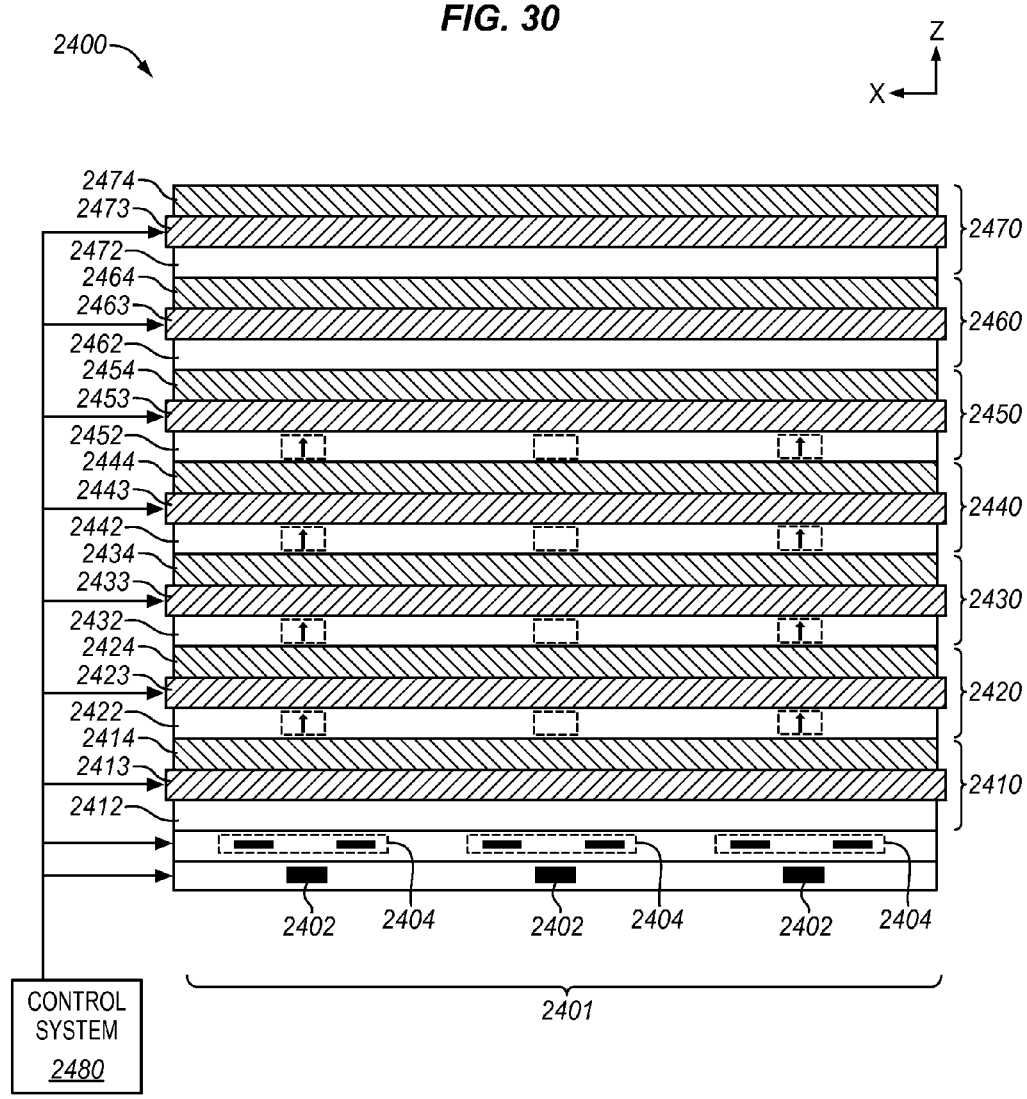
FIG. 30 illustrates the magnetic memory of FIG. 24 with the page of bits erased from the second data storage layer in an exemplary embodiment of the invention.

When the magnetic domains are written into data storage layer 2452, control system 2480 stops applying the electrical current to heating layer 2453 first to allow data storage layer 2452 to cool. Control system 2480 then stops applying the electrical current to heating layer 2463 to allow data storage layer 2462 to cool. FIG. 30 illustrates magnetic memory 2400 with bits written into data storage layer 2452 in an exemplary embodiment. When data storage layer 2462 is cooled, it may be imprinted with magnetic domains from either data storage layer 2452 or data storage layer 2472, which is not shown in FIG. 30.

Data storage layer 2432 is an actual storage layer where the page of bits may be stored. With the page of bits transferred to data storage layer 2452, control system 2480 may erase the page of bits from data storage layer 2422, although it is not necessary.

With the page of bits transferred to storage stack 2430 and/or storage stack 2450, control system 2480 may store another page of bits in storage stack 2410. To write another page of bits into storage stack 2410, control system 2480 applies an electrical current to heating layer 2413, which causes heating layer 2413 to rise in temperature. The heat from heating layer 2413 in turn raises the temperature of data storage layer 2412 so that the magnetization of data storage layer 2412 is more easily changed responsive to an external magnetic field. To ensure that any domains present in the data storage layer 2422 of intermediate stack 2420 do not influence the writing of the data storage layer 2412 of storage stack 2410, control system 2480 applies an electrical current to heating layer 2423 which causes heating layer 2423 to rise in temperature above its Curie temperature to erase any magnetic domains in this layer. Control system 2480 then energizes the cross-point array of current loops 2404 to write the new page of bits in data storage layer 2412. The heating of data storage layer 2412 allows for the magnetic fields to more easily change the magnetization of data storage layer 2412 and create the magnetic domains.

Figure 31:
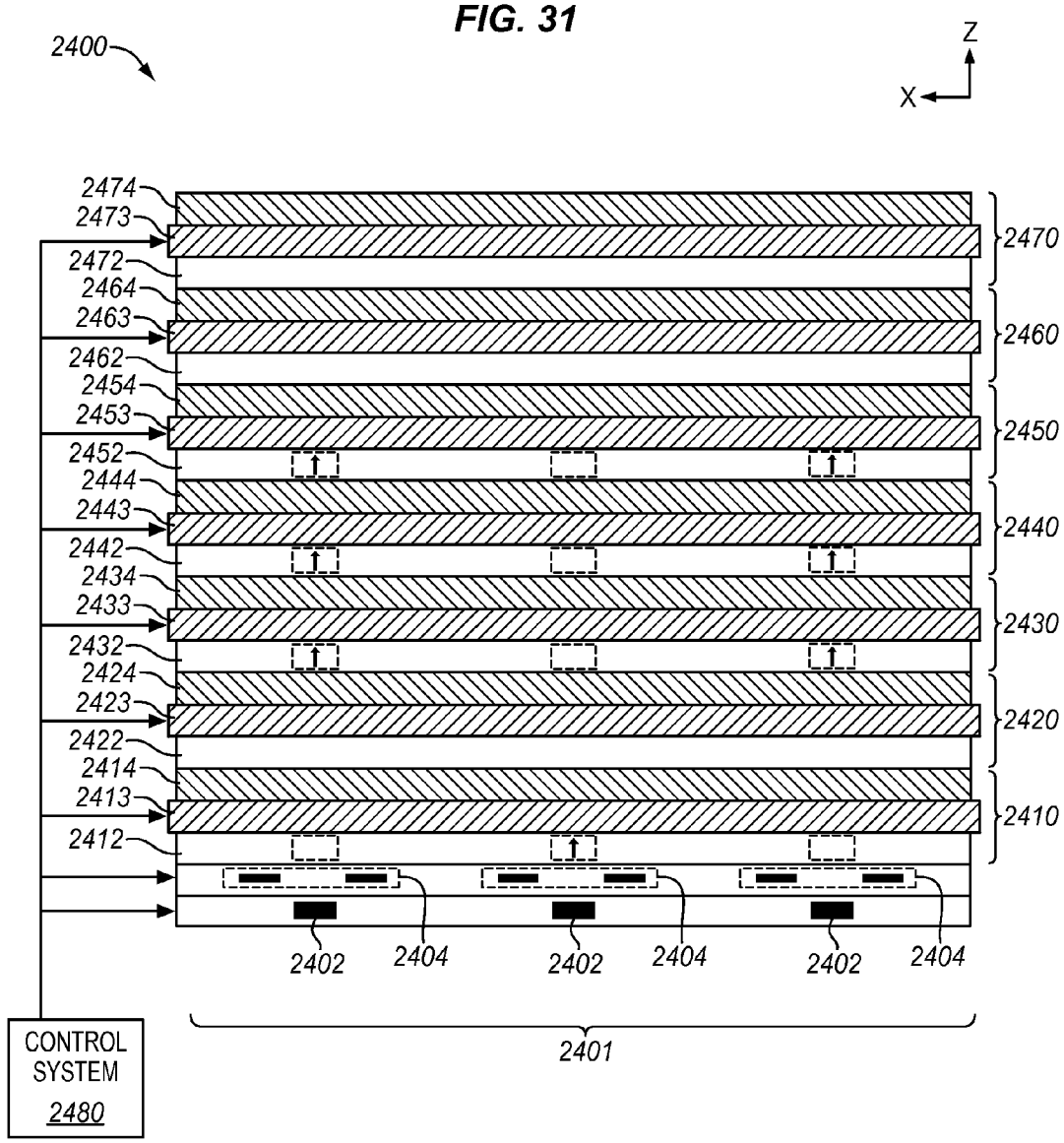
FIG. 31 illustrates the magnetic memory of FIG. 24 with another page of bits written into the first data storage layer in an exemplary embodiment of the invention.

When the magnetic domains are written into data storage layer 2412, control system 2480 stops applying the electrical current to heating layer 2413 to allow data storage layer 2412 to cool with the magnetic domains imprinted. After data storage layer 2412 has cooled sufficiently, control system 2480 stops applying current to heating layer 2423 to allow data storage layer 2422 to cool. FIG. 31 illustrates magnetic memory 2400 with another page of bits written into data storage layer 2412 in an exemplary embodiment. When data storage layer 2422 is cooled, it may be imprinted with magnetic domains from either data storage layer 2412 or data storage layer 2432, which is not shown in FIG. 31.

Although specific embodiments were described herein, the scope of the invention is not limited to those specific embodiments. The scope of the invention is defined by the following claims and any equivalents thereof.

We claim:

1. A memory comprising:
a stack of parallel data storage layers each adapted to store bits of data; and
a control system operable to control a transfer of the bits of data perpendicularly between the data storage layers.

2. The memory of claim 1 wherein:
the data storage layers are each operable to store the bits of data as magnetic domains.

3. The memory of claim 2 wherein:
the control system is further operable to control the transfer of bits of data by controlling the transfer of the magnetic domains from one data storage layer to another data storage layer.

4. The memory of claim 3 wherein:
the control system is further operable to heat the other data storage layer to assist in transferring the magnetic domains from the one data storage layer to the other data storage layer.

5. The memory of claim 2 further comprising:
write elements operable to apply magnetic fields to one of the data storage layers to write the magnetic domains representing the bits in the one of the data storage layers.

6. The memory of claim 5 wherein:
the write elements are formed from a cross-point array of current loops.

7. The memory of claim 2 further comprising:
an array of read elements operable to sense magnetic fields from the magnetic domains in one of the data storage layers to read the bits from the one of the data storage layers.

8. The memory of claim 7 wherein:
the read elements comprise spin valve elements.

9. The memory of claim 7 wherein:
the read elements comprise tunnel valve elements.

10. The memory of claim 7 wherein:
the read elements comprise Hall Effect elements.

11. A memory comprising:
a column of layers adjoined in parallel and comprising at least:
a first data storage layer; and
a second data storage layer;
wherein the first data storage layer is adapted to transfer magnetic domains representing bits of data to the second data storage layer.

12. The memory of claim 11 wherein:
the column of layers further includes a third data storage layer;
wherein the second data storage layer is adapted to transfer the magnetic domains representing the bits of data to the third data storage layer.

13. The memory of claim 11 further comprising:
write elements operable to apply magnetic fields to the first data storage layer to imprint the magnetic domains representing the bits of data in the first data storage layer.

14. The memory of claim 11 further comprising:
read elements operable to sense magnetic fields from the magnetic domains in the first data storage layer to read the bits of data from the first data storage layer.

15. The memory of claim 11 further comprising:
a control system operable to control the transfer of magnetic domains from the first data storage layer to the second data storage layer.

16. The memory of claim 11 wherein:
the first data storage layer and the second data storage layer are each patterned into strips, wherein the strips of the second data storage layer are orthogonal to the strips of the first data storage layer.

17. A memory comprising:
a sequence of thin films deposited on top of one another to define a plurality of parallel storage stacks;
wherein each storage stack includes a layer of magnetic material adapted to store bits of data.

18. The memory of claim 17 further comprising:
a control system operable to control a transfer of the bits of data perpendicularly between the storage stacks.

19. The memory of claim 17 further comprising:
write elements operable to apply magnetic fields to one of the storage stacks to write the bits of data in the one of the storage stacks.

20. The memory of claim 17 further comprising:
read elements operable to sense magnetic fields from one of the storage stacks to read the bits of data from the one of the storage stacks.

* * * * *